United States Patent
Butts et al.

(10) Patent No.: US 6,539,535 B2
(45) Date of Patent: Mar. 25, 2003

(54) PROGRAMMABLE LOGIC DEVICE HAVING INTEGRATED PROBING STRUCTURES

(75) Inventors: Michael R. Butts, Portland, OR (US); Ming Yang Wang, Lafayette, CA (US); Swey-Yan Shei, Cupertino, CA (US); Alon Kfir, San Jose, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 09/989,774

(22) Filed: Nov. 19, 2001

(65) Prior Publication Data

US 2002/0162084 A1 Oct. 31, 2002

Related U.S. Application Data

(63) Continuation of application No. 09/570,142, filed on May 12, 2000, now Pat. No. 6,446,249, which is a continuation-in-part of application No. 09/569,695, filed on May 11, 2000.

(51) Int. Cl.[7] ............................................. G06F 17/50
(52) U.S. Cl. ........................................ 716/17; 703/28
(58) Field of Search .................... 716/2, 5, 17; 365/182; 703/28

(56) References Cited

U.S. PATENT DOCUMENTS

| | | | |
|---|---|---|---|
| 5,524,244 A | * 6/1996 | Robinson et al. ........... | 717/140 |
| 5,754,827 A | 5/1998 | Barbier et al. .............. | 395/500 |
| 5,764,079 A | 6/1998 | Patel et al. ................... | 326/40 |
| 5,777,489 A | 7/1998 | Barbier et al. ................ | 326/40 |
| 5,790,832 A | 8/1998 | Barbier et al. ................ | 395/500 |
| 5,802,348 A | 9/1998 | Stewart et al. ............... | 395/500 |
| 5,943,490 A | * 8/1999 | Sample ......................... | 703/28 |
| 6,014,334 A | 1/2000 | Patel et al. ............. | 365/189.08 |
| 6,157,210 A | 12/2000 | Zaveri et al. ................. | 326/40 |
| 6,202,185 B1 | 3/2001 | Lee ............................. | 714/726 |
| 6,223,148 B1 | 4/2001 | Stewart et al. ................ | 703/25 |
| 6,247,147 B1 | 6/2001 | Beenstra et al. .............. | 714/39 |
| 6,286,114 B1 | 9/2001 | Veenstra et al. .............. | 714/39 |

* cited by examiner

*Primary Examiner*—Matthew Smith
*Assistant Examiner*—Thuan Do
(74) *Attorney, Agent, or Firm*—Orrick, Herrington & Sutcliffe LLP

(57) ABSTRACT

A circuit for an emulation system that has a logic element having a RAM, lookup table, optional delay element and flip-flop/latch. The flip-flop/latch may behave as a flip-flop or as a latch and has separate set and reset signals. The delay element inserts a selectable amount of delay into the data path of the logic element in order to reduce race time problems. The logic elements may be combined to share input signals so as to increase the size of the RAM. The improved circuit also has a playback memory used to store up to a a plurality of copies of sampled data from a logic element so that emulation data can be played back for debugging purposes. Multiple read ports coupled to the logic elements permit a user to read out data from the logic elements during emulation in a time multiplexed manner. The input/output pins may be time multiplexed to carry multiple signals, unidirectionally or bidirectionally.

15 Claims, 26 Drawing Sheets

LOGIC ANALYSIS ARCHITECTURE (LOGICAL VIEW)

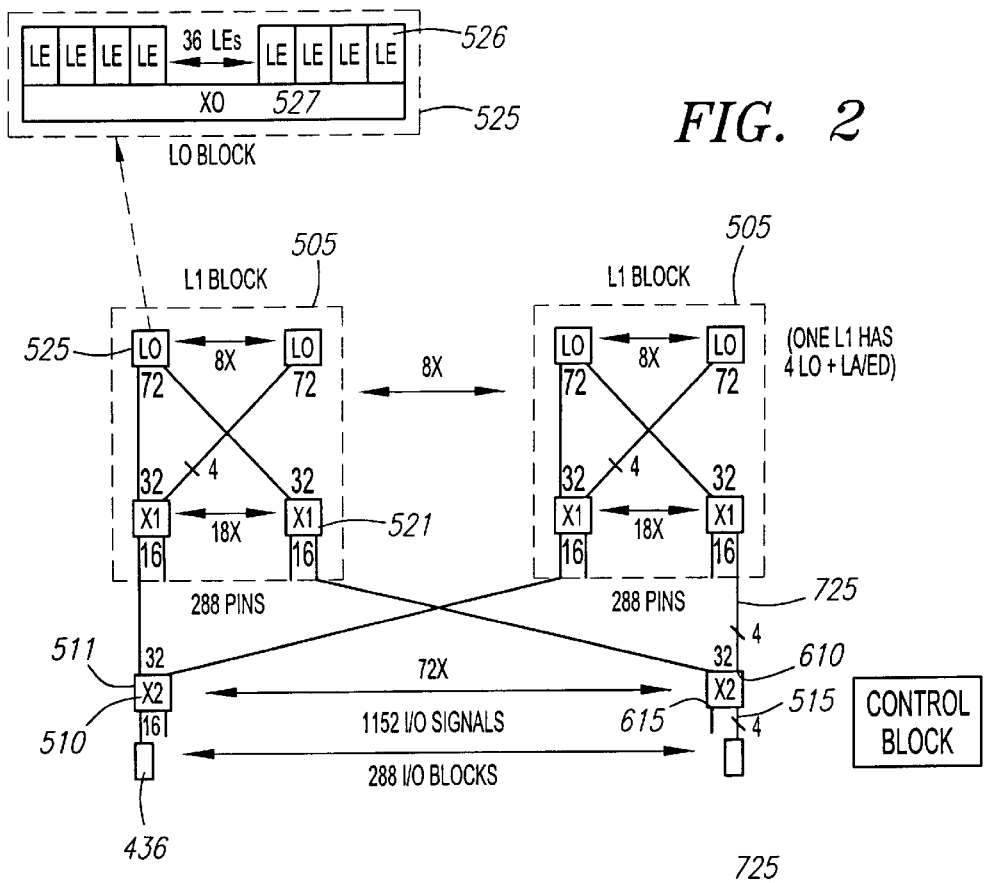
FIG. 2
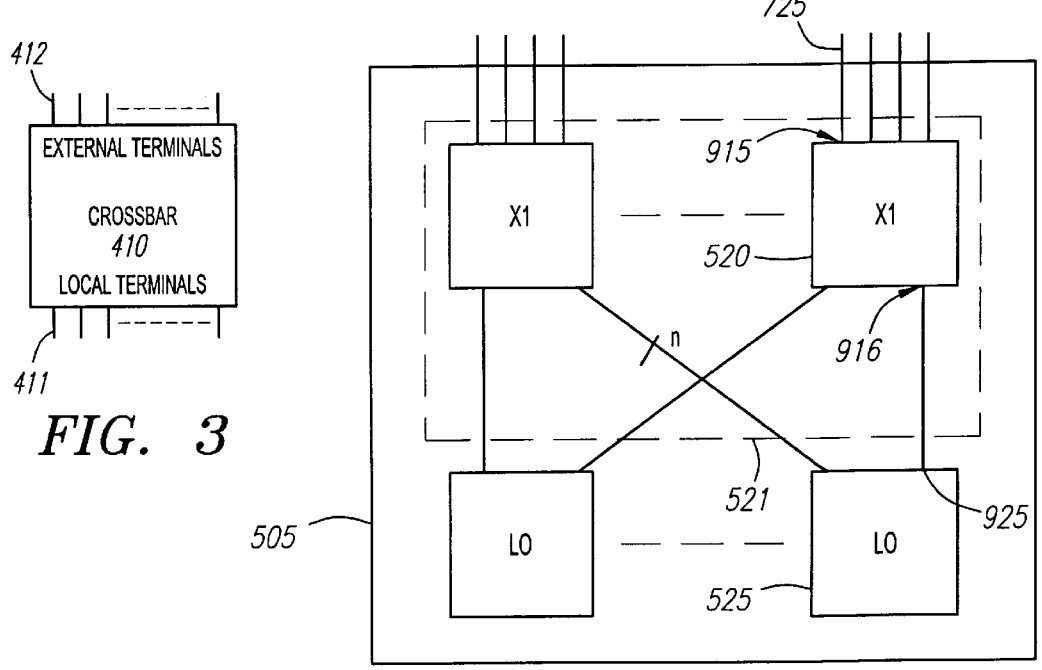
FIG. 3
FIG. 4

X0 OUTPUT CROSSBAR LOGICAL STRUCTURE

| FIG. 21A | |
|---|---|
| | FIG. 21C |
| | FIG. 21B |

PROBE FLIP FLOP ARRAY AND READ PORTS

LOGIC FOR 2-WAY TIME MULTIPLEXING

TIMING FOR 2-WAY TIME MULTIPLEXING

LOGIC FOR 4-WAY TIME MULTIPLEXING (UNI-DIRECTIONAL OUTPUT)

I/O BLOCK DETAILED HARDWARE BLOCK DIAGRAM (JTAG BOUNDARY SCAN NOT SHOWN)

PROGRAMMABLE LOGIC DEVICE HAVING INTEGRATED PROBING STRUCTURES

RELATED APPLICATIONS

This application is a continuation of U.S. application Ser. No. 09/570,142, filed May 12, 2000, now U.S. Pat. No. 6,446,249 which is continuation-in-part of co-pending U.S. patent application Ser. No. 09/569,695 filed May 11, 2000. Application Ser. Nos. 09/570,142 and 09/569,695 are hereby incorporated herein by reference. U.S. Pat. No. 6,289,494, entitled "OPTIMIZED EMULATION AND PROTOTYPING ARCHITECTURE", filed Nov. 12, 1997, is hereby incorporated herein by reference in its entirety and made part of the present application.

FIELD OF THE INVENTION

The field of the invention relates generally to an integrated circuit chip for an emulation system; and, more particularly to an improved logic element for an emulation system with a hold time algorithm that eliminates race time problems.

BACKGROUND OF THE INVENTION

General purpose programmable logic chips that are available as off-the-shelf components (i.e., are commercially available) are generally not custom designed for special applications such as logic emulation, prototyping and computing. Examples of general purpose programmable logic chips are field programmable gate arrays ("FPGAs"), programmable logic arrays ("PLAs") and programmable array logic ("PALs"). General-purpose programmable logic chips have served adequately in the initial development of applications such as hardware logic emulation, prototyping and computing. However, in these applications, general-purpose logic chips have some drawbacks. Many general-purpose logic chips emphasize speed and density (i.e., how many logic gates can be implemented in a single chip) above other goals. To be cost effective for most applications, a general-purpose programmable logic architecture should provide routing resources sufficient to give a good chance of fitting a design therein and allowing the use of most of the available logic gates in the integrated circuit. However, with a general-purpose programmable logic architecture, there is always a possibility that a given design or partition may not be implementable, even though the gate count (i.e., the number of gates that the manufacturer of the programmable logic chip claims the chip can implement) is within the rated capacity of the chip. Also, the speed of the compile process is of lesser importance in the general purpose logic chip.

In contrast, in a logic emulation, prototyping or computing application, the priorities are different. The logic chip is normally part of a larger, multi-chip system, often with tens or hundreds of logic chips. Large input design netlists must be automatically compiled into all these logic chips with a very high degree of success and a minimum of user intervention. A netlist is a description of a logic design that specifies the components of the design (e.g., the logic gates) and how the components are interconnected. Each "net" of a netlist defines a circuit path between pins on a component or an input/output pad. It is essential that the logic chip used in these applications provide routing resources which are flexible and capable enough to nearly always succeed in allowing most of the logic resources to be used by a fully automatic compile process. This compile process should execute rapidly. Fast compile times minimize the time required to get from the time the user's design is presented to the emulator system to the time all the logic chips are programmed and ready to run the user's design (i.e., emulate the user's design).

The differences between the goals of the general purpose logic chip and the goals of a logic chip used in emulation, prototyping and computing applications present a situation where there is a need for a logic chip which is specialized for logic emulation, prototyping and computing applications.

Moreover, the design and interconnect flexibility of integrated circuits used for emulation should reduce the probability of routing failure as much as possible, result in high predictability of the capacity of gates which can be emulated, and resolve certain timing problems. A common problem with partitioning very large designs into a large number of programmable logic chips is that the timing of the original netlist is not preserved. The natural partitions of the original design probably reflect the timing in the final single chip implementation. However, the software which decomposes and re-partitions the netlist onto a programmable logic target must impose a different partitioning for that target. Signal path delays are expanded, and not uniformly. These differential expansions of delays may introduce timing problems (i.e., skews, setup and hold violations) which are not inherent in the design netlist. Occasionally, timing problems which are present in the design netlist will be hidden by the mapping onto the programmable logic system. Both of these timing problems may be unsatisfactory to a user or emulator. An emulation architecture must detect introduced timing problems and have the hardware for removing these timing problems.

Emulation integrated circuits are traditionally structured in a multi-level hierarchy, with simple logic blocks capable of performing the desired logic functions combined together to form more complex blocks, which are then combined to form a complete chip. Typically, the amount of interconnect is greatest at the lowest level of the hierarchy and decreases at the upper levels. Consequently, the design of the lowest level interconnect has a large effect on overall chip size and cost.

Interconnect at the lowest level of the hierarchy has traditionally been achieved through either (1) a partially populated multiplexer structure which interconnects rows and columns of logic elements (employed, for example, in the Xilinx 4000 series FPGAs), or (2) a full crossbar which interconnects a small group of logic elements (employed, for example, in the Altera Flex 8000 family of FPGAs). However, the partially populated multiplexer structure suffers from limited routing flexibility. Circuit designs which require many local connections from one logic element to another may not be routable at all in a given chip, or alternately, may require very complex software and long computation times in order to complete routing between logic elements.

A full crossbar interconnect at the lowest level of the hierarchy avoids the problems of a partially populated multiplexer interconnect by guaranteeing complete interconnectivity between a small group of logic elements. The drawback to a full crossbar interconnect scheme, however, is the amount of silicon required to implement a full crossbar. Required silicon area is proportional to the square of the number of logic elements being interconnected. Thus, only a small number of logic elements can be interconnected via full crossbar before the cost becomes prohibitive. By way of example, the lowest level block in the Altera Flex 8000 chip has eight logic elements. It is difficult to construct large integrated circuits using such small low-level blocks, because excessive numbers of blocks and interconnect signals are needed at higher levels in the chip.

Because the logic element is the fundamental building block of a logic block which in turn is used to build an integrated circuit chip for an emulation system, improvements in the logic element are needed in order to achieve greater accuracy and efficiency in emulation. Race time problems and other performance related issues create a need to improve present day logic elements. There is also a need to provide testing and probing functions.

Further limitations and disadvantages of conventional systems and circuits will become apparent to one of skill in the art after reviewing the remainder of the present application with reference to the figures.

SUMMARY OF THE INVENTION

Various separate aspects of the invention can be found in an improved circuit for an emulation system. The improved circuit has a logic element having a RAM, lookup table, optional delay element and flip flop/latch. The flip/flop latch may behave as a flip flop or as a latch and has separate set and reset signals. The delay element inserts a selectable amount of delay into the data path of the logic element in order to reduce race time problems. The logic elements may be combined to share input signals so as to increase the size of the RAM. The improved circuit also has a shadow memory used to store sampled data from a logic element and to playback emulation data for debugging purposes. Multiple read ports permit a user to read out data from the improved circuit during emulation in a time multiplexed manner. The input/output pins may be time multiplexed to carry multiple signals, unidirectionally or bidirectionally. The improved circuit also has a hold time algorithm to reduce race time problems.

A first, separate aspect of the invention is a logic element for a logic block of an integrated circuit for use in an emulation system where the logic element includes a delay element that inserts an adjustable amount of delay into the data path of the logic element.

A second, separate aspect of the invention is a logic element for an integrated circuit for use in an emulation system, where the logic element includes a flip-flop latch that has separate set and reset signals.

A third, separate aspect of the invention is a logic element for an integrated circuit for use in an emulation system, where the logic element includes a six input lookup table.

A fourth, separate aspect of the invention is an integrated circuit for use in an emulation system that has a memory for stores sampled data from a logic element and plays that data for display to the user.

A fifth, separate aspect of the invention is a logic element for an integrated circuit for use in an emulation system, where each logic element has a RAM and logic elements can be combined to create a larger RAM.

A sixth, separate aspect of the invention is an integrated circuit for use in an emulation system that has multiple read ports that permit a user to read out data from the improved circuit during emulation in a time multiplexed manner.

A seventh, separate aspect of the invention is an integrated circuit for use in an emulation system whose input/output pins may be time multiplexed to carry multiple signals unidirectionally.

An eighth, separate aspect of the invention is an integrated circuit for use in an emulation system whose input/output pins may be time multiplexed to carry multiple signals bidirectionally.

A ninth, separate aspect of the invention is a method of emulation that practices any of the above separate aspects, either individually or in some combination.

A tenth, separate aspect of the invention is any of the above separate aspects, either individually or in some combination.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 2 illustrates a block diagram of a portion of the example embodiment of the emulation chip of FIG. 1A.

FIG. 3 illustrates a block diagram of a simple crossbar.

FIG. 4 illustrates a block diagram of the components of a L1 logic block.

DETAILED DESCRIPTION OF A PREFERRED EMBODIMENT

Turning to the figures, the presently preferred apparatus and methods of the invention will now be described.

To be suited optimally for emulation, a logic chip should be electronically reconfigurable any number of times, configurable according to any digital combinational logic network, and freely connectable to any digital network. The following general discussion provides a general background with reference to the figures. Additional, detailed description of programmable logic systems and interconnect networks can be found in U.S. Pat. Nos. 5,036,473, 5,109,353, 5,448,496, and 5,452,231, each of which is assigned to the assignee of the present application. The disclosures of U.S. Pat. Nos. 5,036,473, 5,036,353, 5,448,496, and 5,452,231 incorporated herein by reference in their entireties.

An integrated circuit built in accordance with the invention may contain internal logic blocks which can be programmed to provide combinational logic functions (e.g., AND gates, OR gates, etc.), sequential logic functions (e.g., flip-flops, latches, etc.) and storage functions. Each logic block contains a plurality of input/output ("I/O") pins which are used to interconnect the logic blocks to circuitry outside of each particular logic block. The integrated circuit may also include external input/output ("I/O") pads and programmable interconnect. External I/O pads allow for connection to other chips and devices. Programmable interconnect acts to pass signals among the logic blocks and/or I/O pads. In particular, the programmable interconnect uses a partial crossbar interconnect architecture.

Figure 1A:
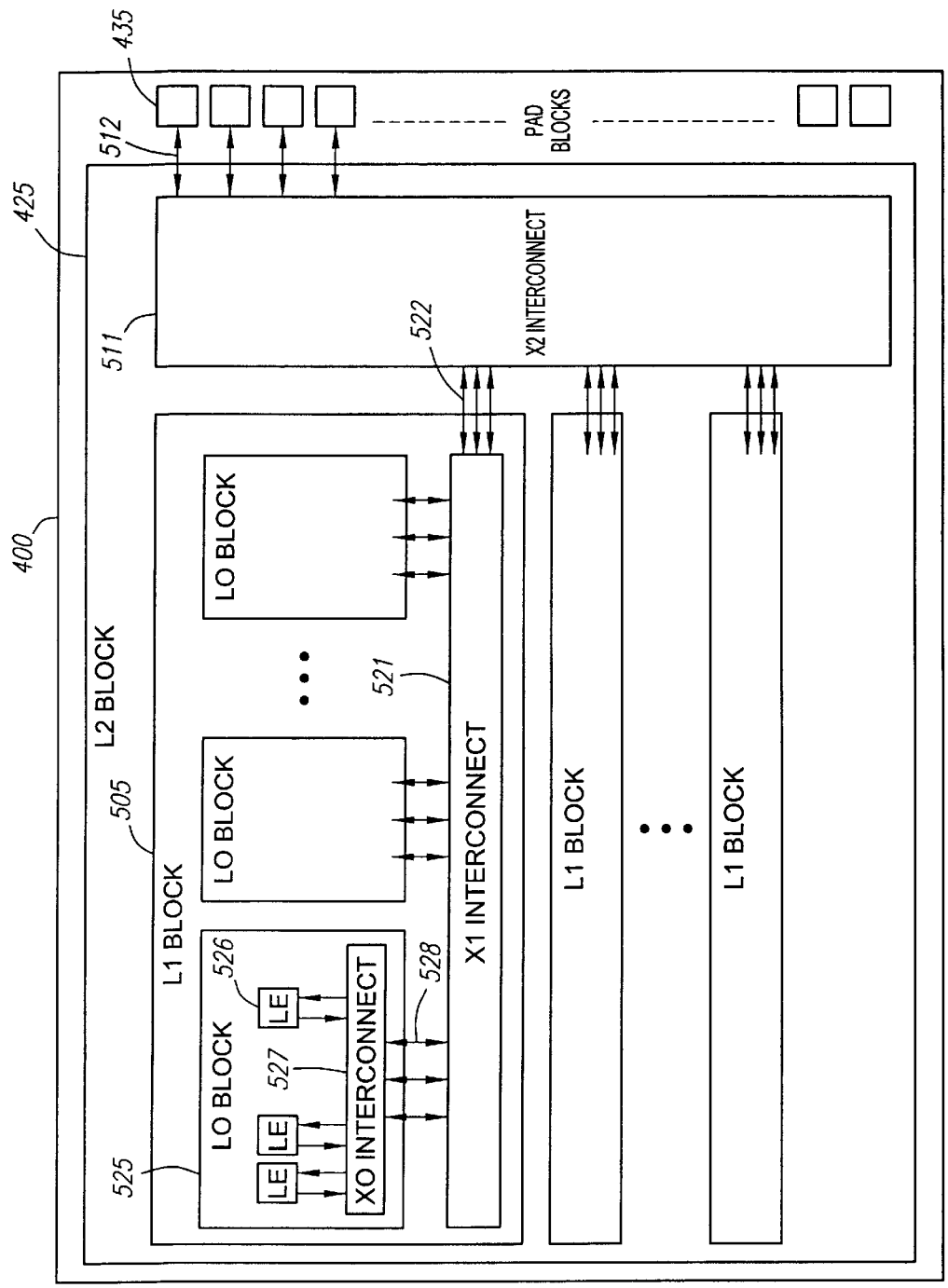
FIG. 1A illustrates a block diagram of the major components in one embodiment of an emulation chip that is built in accordance with the invention.

A programmable logic chip with three levels of hierarchy is shown in FIG. 1A. The hierarchy of this chip is now discussed. The first-level logic block will be referred to as the L0 block 525. It contains a number of logic elements (LE) 526, each of which can provide a small combinational logic function and/or a small amount of storage. Sometimes, logic elements are also referred to as logic units (LU) because they are the basic building blocks in the integrated circuit. The LEs 526 are interconnected by an interconnect that will be referred to as X0 interconnect 527. X0 interconnect 527 also comprises I/O pins 528 that allow for connections to the next level of interconnect.

The second-level logic block will be referred to as the L1 block 505. It contains a number of L0 logic blocks 525 that are interconnected by an interconnect which will be referred to as X1 interconnect 521. X1 interconnect 521 also has I/O pins 522 for connections to the next level up. The third-level logic block will be referred to as the L2 block 425. L2 block 425 contains a number of L1 logic blocks 505. L1 logic blocks 505 are interconnected by an interconnect which will be referred to as X2 interconnect 511. X2 interconnect 511 has I/O pins 512. In the presently preferred embodiment of the invention, a single L2 logic block comprises an entire programmable logic chip. Its I/O pins 512 connect to chip I/O pads 435, which may be connected to external pins or leads when the chip is packaged.

Enough I/O pins should be provided to support the logic capacity of the logic blocks at each level. The preferred size of each of the X0 interconnect 527, X1 interconnect 521 and X2 interconnect 511 is a function of how many I/O pins must be interconnected. An optimum balance should be struck between the total number of levels used, the sizes of the logic blocks at each level, the numbers of logic block I/O pins at each level and the resulting size of the interconnects.

The X0 interconnect 527, X1 interconnect 521 and X2 interconnect 511 in the multi-level hierarchically interconnected programmable logic chip of FIG. 1A may use one or more of many different architectures. For example, crossbar-based architectures are used, either a single simple crossbar, fully or partially populated, or else a partial crossbar interconnect comprising multiple simple crossbars.

Figure 1B:
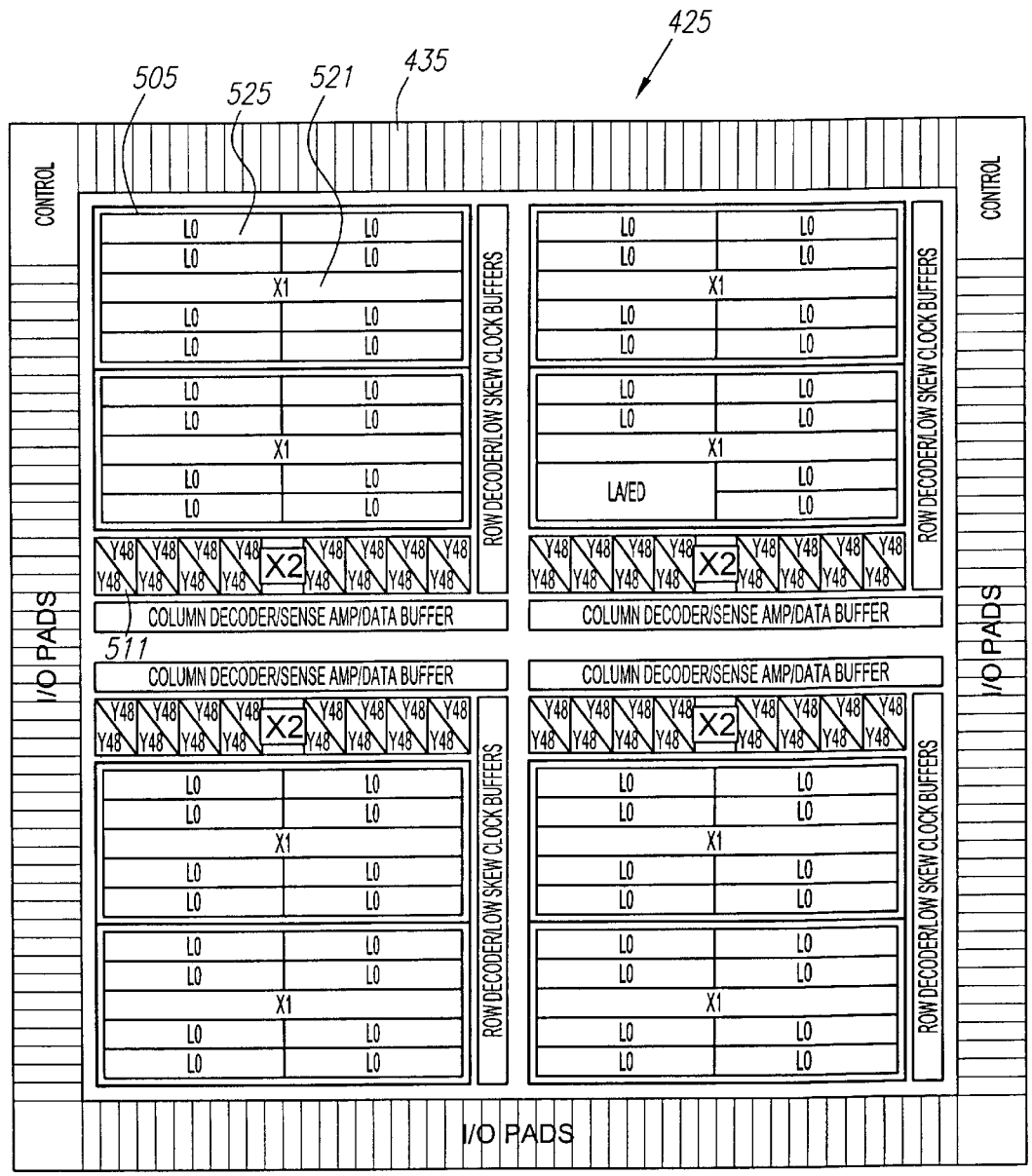
FIG. 1B illustrates a block diagram of an example chip floor plan of the embodiment of the emulation chip of FIG. 1A.
Figure 9:
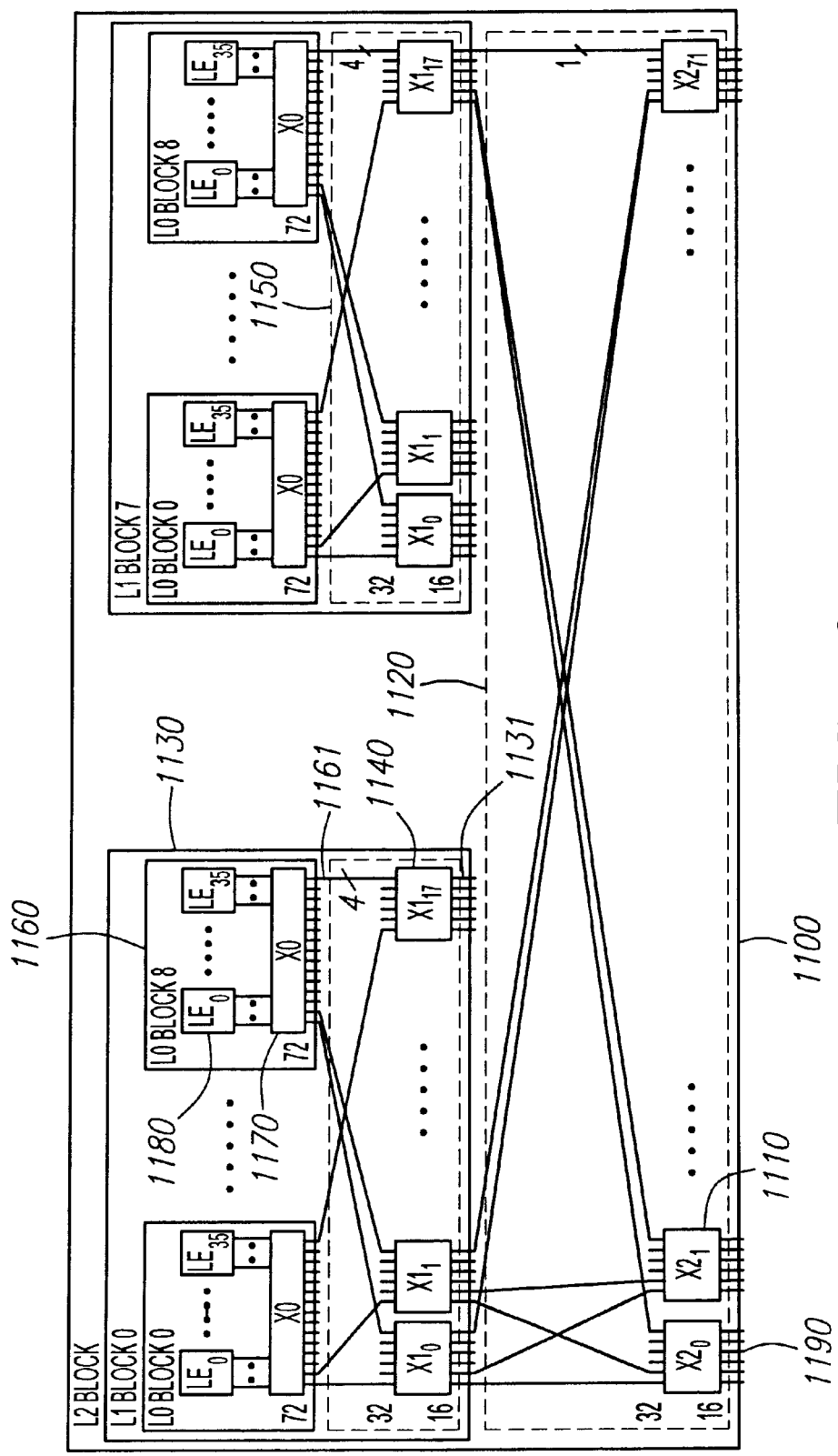
FIG. 9 illustrates a block diagram of the logical structure of the embodiment of the emulation chip of FIG. 1A.

One possible chip floor plan of the programmable logic chip of FIG. 1A is shown in FIG. 1B. FIG. 9 illustrates the logical structure of the L2 logic block 1100 arrangement of FIG. 1B. The single L2 logic block 425 is structured to function as an emulation and prototyping chip. In the L2 chip architecture 425, a plurality of X2 crossbars form an X2 partial crossbar interconnect 511 between a plurality of L1 logic blocks 505. Each L1 logic block 505 contains a plurality of X1 crossbars which form an X1 partial crossbar interconnect 521 between a plurality of L0 logic locks 525. Each L0 logic block 525 contains an X0 interconnect which interconnects a plurality of logic elements (not shown). Input/output pads 435 are connected to L2 logic block I/O pins. Some of the pads are used for secondary control purposes, and for power and ground connections.

There are seventy-two X2 crossbars 1110 in the X2 partial crossbar interconnect 1120. Each X2 crossbar has thirty-two (32) local terminals, each of which is connected to an L1 logic block I/O pin. Each X2 crossbar has sixteen (16)

external terminals, each of which is an L2 logic block I/O pin 1190. The L2 logic block 1100 includes four hundred thirty two (432) pads 1190, of which two hundred eighty eight (288) are pads connected to L2 logic block I/O pins 1190. The remaining pads are used for secondary control purposes, and for power and ground connections.

There are eight L1 logic blocks 1130, each containing 288 I/O pins and an X1 partial crossbar interconnect 1150, which comprises eighteen X1 crossbars 1140. Each X1 crossbar has thirty-two (32) local terminals, each of which is connected to an L0 logic block I/O pin. Each X1 crossbar has sixteen (16) external terminals, each of which is an L1 logic block I/O. Each L1 logic block 1130 contains eight L0 logic blocks 1160, each of which includes seventy-two I/O pins and an X0 interconnect 1170, which connects thirty-six logic elements (LEs) 1180. Each LE 1180 contains a memory element, a flip-flop/latch, and a programmable delay element. There are two hundred eighty-eight (288) LEs 1180 within each L1 logic block 1130. Therefore, there are two thousand three hundred four (2304) LEs 1180 within the L2 logic block 1100. Such an L2 logic block on a programmable logic chip may be arranged according to many other possible layouts, the choice of which is dictated only by efficiency of size and routing.

As shown in FIG. 2, which is a particular embodiment of the multi-level hierarchically interconnected programmable logic chip of FIG. 1A, there are thirty-six LE's 526 per L0 block 525, eight L0 blocks 525 per L1 block 505, and eight L1 blocks 505 per L2 block. There are eighteen X1 interconnect networks 521 per L1 block 505, 72 X2 blocks 511 per L2 block which carry a total of 1152 I/O signals, and 288 I/O blocks 435. Of course, the invention is not limited to any specific number of these components. The number of levels in the multi-level hierarchy as well as the number of a specific component may be selected from any appropriate numbers.

Examples of the crossbar interconnect architectures are now discussed. A schematic block diagram of a simple crossbar 410 is shown in FIG. 3. Crossbar 410 can be programmed to establish connections between the local terminals 411. If the crossbar 410 is fully populated, then any connection from any local terminal 411 to one or more other local terminals 411 may be programmed. If it is partially populated, then some connections, but not all such connections, may be programmed. Partially populated crossbars are less costly in hardware, but less capable at interconnection, and may require more complicated software or additional software routines to determine connections.

External terminals 412 for crossbar 410 are shown in FIG. 3. Crossbar 410 can establish connections between external terminals 412 and local terminals 411, but not necessarily between external terminals 412 and other external terminals 412. When crossbar 410 is used in a partial crossbar interconnect, the local terminals 411 are connected to the logic blocks being interconnected, and the external terminals 412 are used as I/O pins for the resulting higher-level logic block. Numerous types of crossbars are possible, many of which are described in the U.S. patents and patent applications which are mentioned in this specification and incorporated herein by reference. These forms of implementation of crossbars 410 are within the scope of the invention, so long as enough routability is available to satisfy the application. For example, the crossbar 410 may be a crosspoint-type crossbar where each of the local terminals 411 and the external terminals 412 is connected to a programmable bidirectional transceiver (not shown). Further, variations in any of the interconnect architecture are also contemplated. For example, implementations of partial crossbar interconnects on a chip may take different forms than they do at the system level, since the logic blocks being interconnected, the crossbars and the interconnecting wires are all in the same medium, not separated into different packages. An emulation system that uses the improved logic element may include several ways of implementing partial crossbar interconnections on a chip. The partial crossbar interconnect may be applied hierarchically, using multiple levels of crossbars to span large numbers of logic blocks more efficiently than a single-level partial crossbar interconnect.

The components of each L1 logic block 505 are shown in FIG. 4. The X1 interconnect 521 consists of X1 crossbars 520 with local terminals 916 and external terminals 915, that are each instances of crossbar 410 (shown in FIG. 3), and the wires connecting the local terminals 916 with the L0 logic block I/O pins 925. In this X1 interconnect 521, X1 crossbars 520 are connected to L0 logic blocks 525 such that the I/O pins 925 of each L0 logic block 525 are divided into proper subsets, using the same division on each L0 logic block 525. The local terminals 916 of each X1 crossbar 520 are connected to the same subset of I/O pins 725 from each of every L1 logic block 505. The external terminals 915 are connected to the I/O pins 725 of the L1 logic block 505, which are connected to the X2 crossbars 510 as shown in FIG. 2.

Depending on the number of L0 logic blocks 525, the number of I/O pins 925 on each L0 logic block 525, the number of X1 crossbars 520 and the number of local terminals 916 on each X1 crossbar 520, there will be some number "n" of wires between each L0 block 525 and X1 crossbar 520 pair. For example, if there were 8 L0 logic blocks 525 with 64 I/O pins 925 on each, and 16 X1 crossbars 520 with 32 local terminals 916 on each, then "n" would equal four. That is, there would be four wires between each L0 block 525 and X1 crossbar 520 pair. The higher the value of "n", the greater the ease of routing and the higher the likelihood of routing success.

Other means of implementing crossbars 410 may be more suitable for use in a programmable logic chip for a particular application because they are more congruent with the rectilinear layout of components on a single silicon die, as is commonly practiced when laying out integrated circuits and because these other implementations have operational advantages. Thus, for example, crossbar 410 may be implemented as a multiplexer-type crossbar. This multiplexer implementation of a crossbar advantageously has a propagation delay that is relatively insensitive to the crossbar's programming. Additional details about the above types of crossbars are provided, for example, in U.S. patent application Ser. No. 08/968,401 titled "OPTIMIZED EMULATION AND PROTOTYPING ARCHITECTURE," Lyon & Lyon docket number 220/290.

Figure 5:
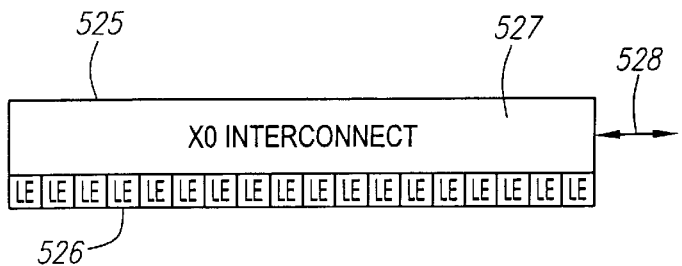
FIG. 5 illustrates a block diagram of the basic components of a L0 logic block in their relative physical arrangement on an example embodiment of an emulation chip.

FIG. 5 shows the basic components of an L0 logic block 525 in their relative physical arrangements on the logic chip. An X0 interconnect 527 has logic elements (LEs) 526 placed along one or both of its long dimensions. The L0 block 525's I/O pins 528 are located on one or both ends of the X0 interconnect 527. The X0 interconnect 527 may be constructed in one of many different forms, including a fully populated simple crossbar, or a partially populated simple crossbar, or a combination of both.

Figure 6:
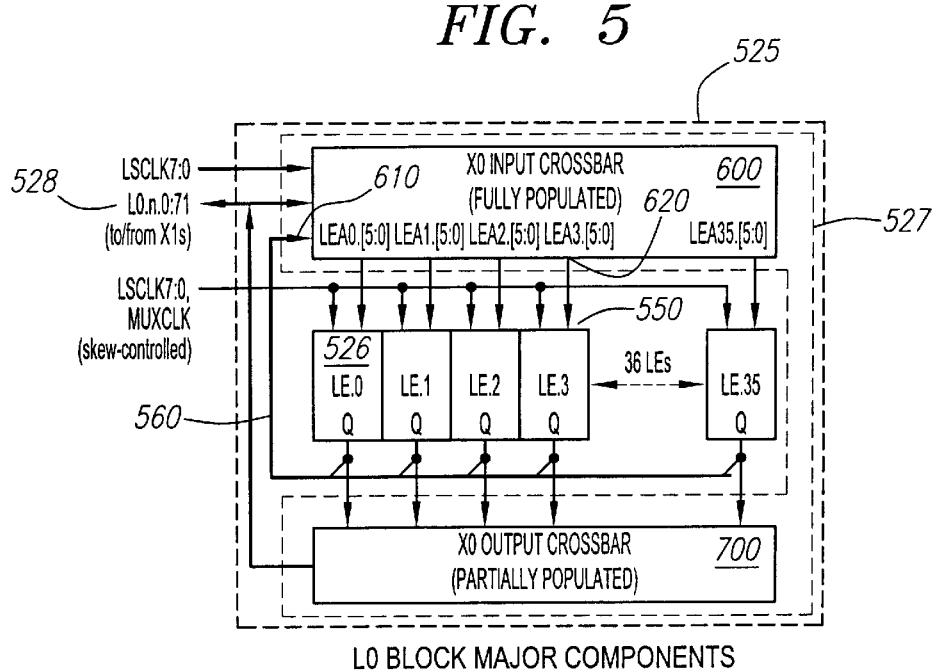
FIG. 6 illustrates a block diagram of an example embodiment of an X0 interconnect network in an L0 logic block.
Figure 7:
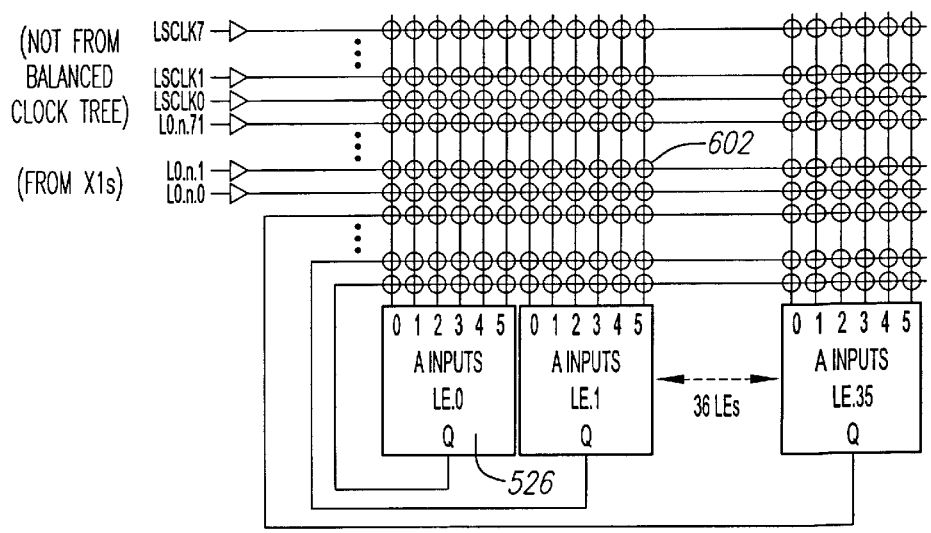
FIG. 7 illustrates a logical depiction of a fully populated crossbar of the X0 input crossbar of FIG. 6.
Figure 8:
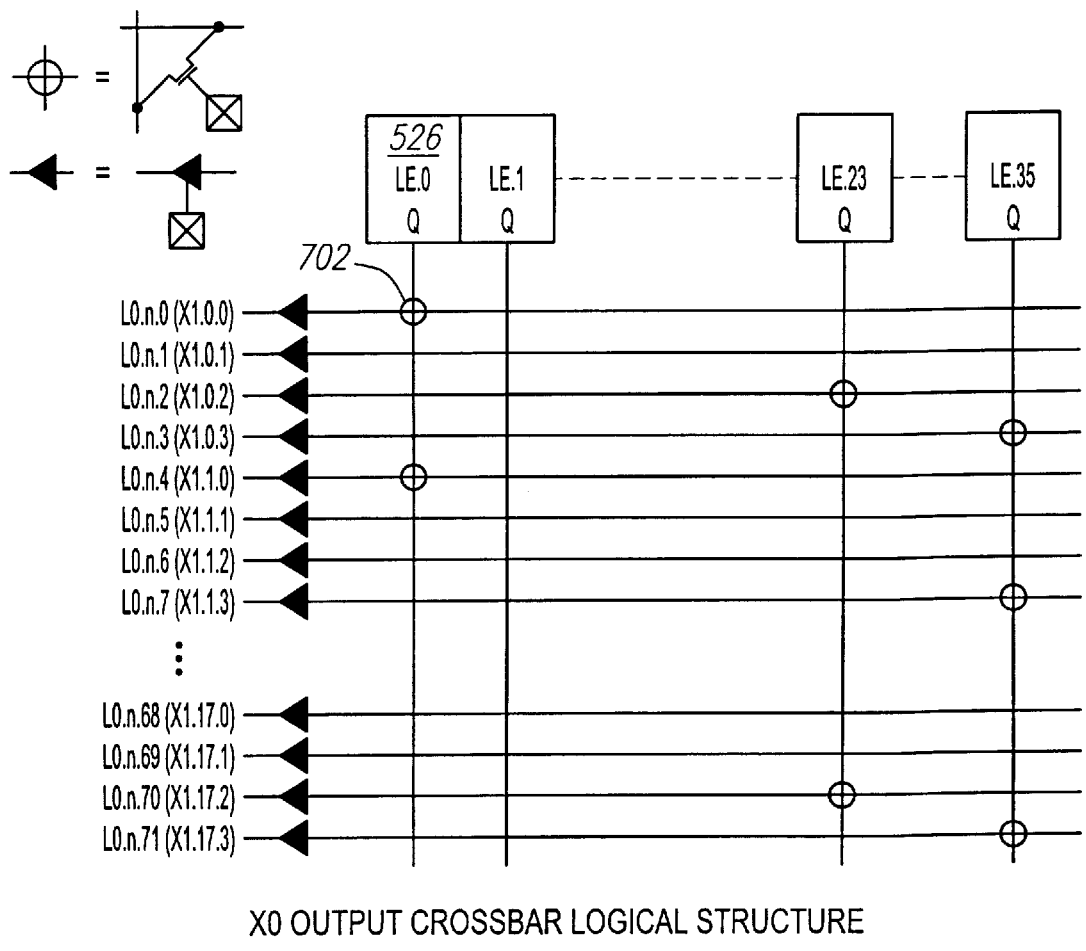
FIG. 8 illustrates a logical depiction of a partially populated crossbar of the X0 output crossbar of FIG. 6.

FIG. 6 shows one possible implementation of the X0 interconnect 527 in an L0 logic block 525. X0 interconnect 527 is composed of two crossbars, the X0 input crossbar 600 and the X0 output crossbar 700. This permits each crossbar to be optimized according to its function. In this particular example of the X0 interconnect 527, the X0 input crossbar 600 is a fully populated crossbar and the X0 output crossbar 700 is a partially populated crossbar, although other types of crossbars are also contemplated. FIG. 7 illustrates a logical depiction of the fully populated X0 input crossbar 600 of FIG. 6 and shows that each input of each LE is connected to the X0 input crossbar 600 (as represented by circles 602). Similarly, FIG. 8 is a logical representation of a partially populated L0 output crossbar and shows that some outputs of the LEs are connected to the L0 output crossbar (as represented by circles 702). Returning to FIG. 6, the X0 input crossbar 600 gets inputs from the LE outputs 560 and from the L0 logic block I/O pins 528. The outputs of the X0 input crossbar 600 are connected to the inputs 550 of each of the LEs 526. The X0 output crossbar 700 gets inputs from the LE outputs 560. Its outputs are connected to the L0 logic block I/O pins 528.

Figure 10:
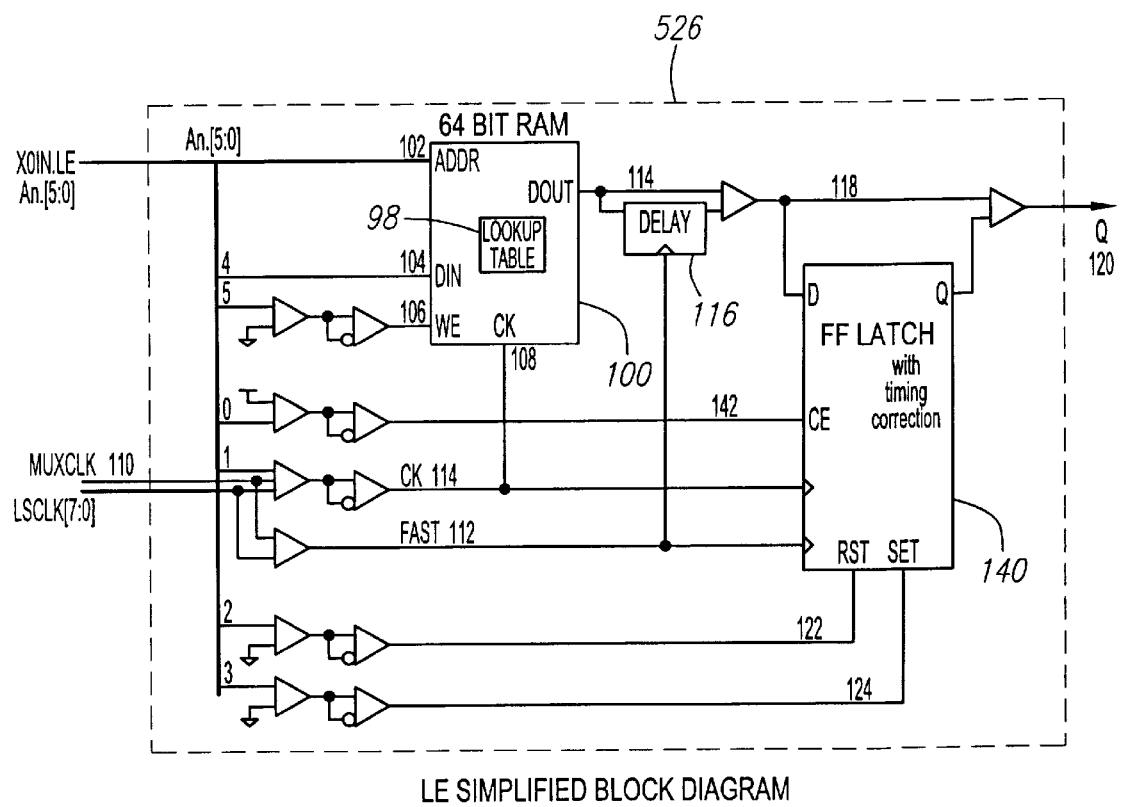
FIG. 10 illustrates a simplified block diagram of an embodiment of the logic element built in accordance with the invention.
Figure 11:
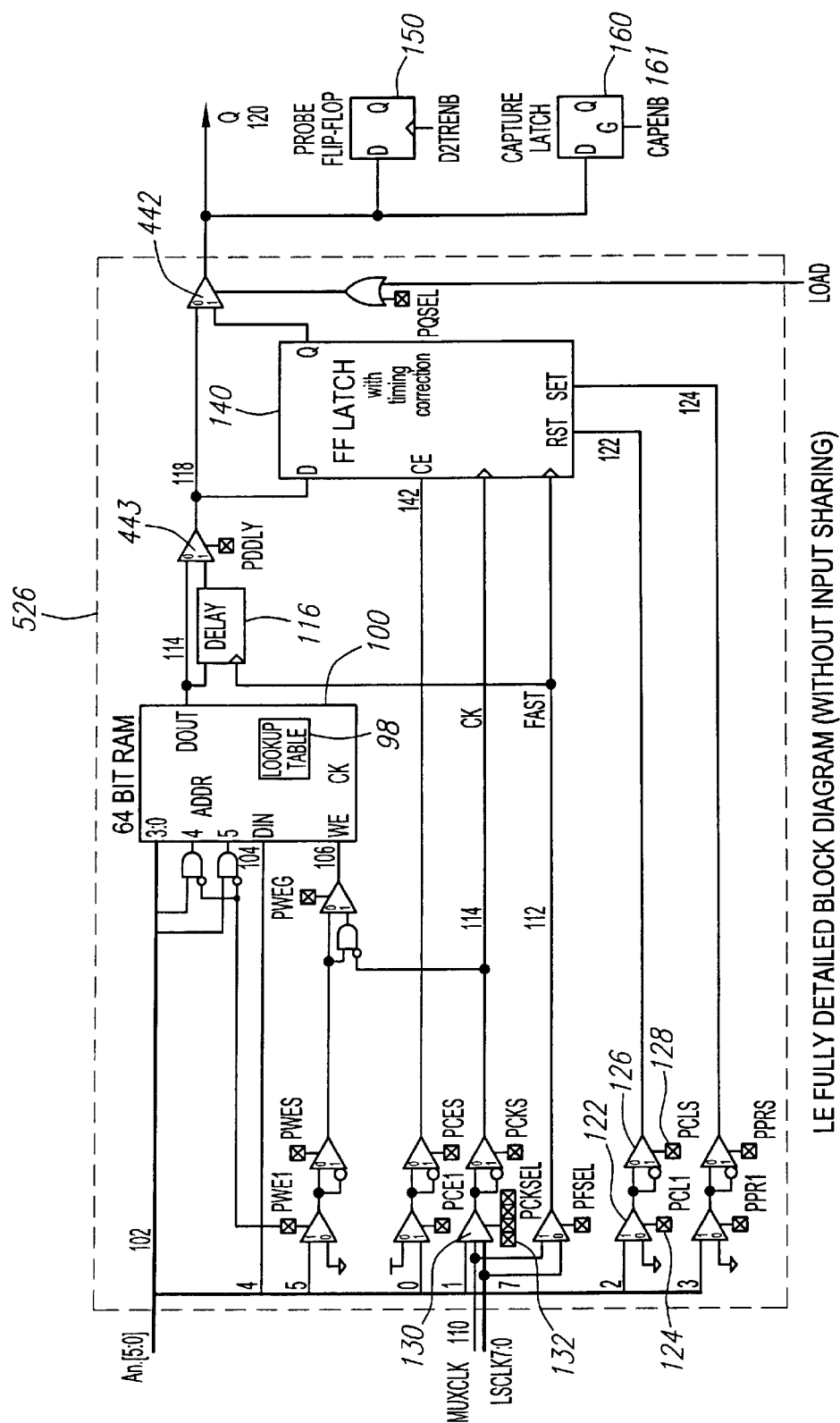
FIG. 11 illustrates a detailed block diagram of an embodiment of the logic element built in accordance with the invention.

FIGS. 10 and 11 illustrate a logic element LE 526 built in accordance with one embodiment of the invention. FIG. 11 illustrates the details not shown in FIG. 10, but does not illustrate an optional input sharing feature discussed later with respect to FIGS. 13 and 14. The logic element 526 includes a 64 bit RAM 100, a lookup table 98 in the RAM 100, an optional delay element 116 and a programmable flip-flop/latch 140. Connected to the logic element 526 are a probe flip flop 150 and capture latch 160. There are two clock signals, CK 114 and fast (FAST) clock 112. The 64 bit RAM 100 receives address bits 102, data input 104, write enable signal 106 and CK clock 114. The flip-flop/latch 140 receives data 118, active-high clock enable signal 142, clock CK 114, FAST clock 112, asynchronous reset signal 122 and asynchronous set signal 124. The six inputs to the logic element 526 supply address bits to the lookup table 98 which outputs a data bit output 114. Although the inputs to the logic element 526 are typically data bits, they can also be used as clocks. For example, a logic element input signal may be used to clock the flip-flop/latch 140 whenever that signal is activated. FIG. 11 shows input multiplexers such as multiplexer 122 and the programming bit 124 used to select the value of RESET signal 122. Likewise, input multiplexer 126 is controlled by programming bit 128 and input multiplexer 130 is controlled by multiple programming bits 132. Hence, input multiplexers control the state of the CK clock signal 114, clock enable signal 142, SET signal 124 and RESET signal 122 to the flip-flop/latch 140. A processor may write the configuration bits into the RAM, or alternatively, an EPROM.

In this particular embodiment, the lookup table 98 is a static random access memory (SRAM) that performs any combinational function involving up to six variables. The combination of a lookup table 98 and input multiplexers to control the flip-flop/latch 140's CK clock signal 114, clock enable signal 142, RESET signal 122 and SET signal 124 results in a logic element 526 whose inputs may be freely swapped to carry any signal. For example, a given signal may be transmitted on any one of the six logic element input lines, thereby creating a flexible logic element which can implement a given function in a variety of ways. When logic element inputs are swapped, the contents of the lookup table 98 are altered accordingly so that the logic element can implement the same function. Similarly, when logic element inputs that control an input multiplexer (CK clock, clock enable, reset or set) are swapped, the configuration bits that control the multiplexer are changed to reflect the swapped inputs. Such flexibility of the use of each input to the logic element 526 also results in better routability of the higher level blocks (such as the L1 and L2 blocks). Using these logic elements 526, almost any combinatorial or sequential logic function can be implemented. Logic elements 526 may also be swapped freely during L0 routing to perform a given function.

The delay element 116 receives the data output 114 from the RAM 100 and is clocked by FAST clock 112. The flip-flop/latch 140 may act as either a latch or a flip-flop, depending on the function being implemented by the logic element 526. A flip-flop transfers the data on its D input line to the Q output line on the edge of a clock signal; whereas, a latch continuously transfers data from the D input line to the Q output line until the clock signal falls low. The data-in multiplexer 443 allows the delay generated by delay element 116 to be selectively inserted into the data stream. The flip-flop/latch 140 can be preloaded with data. The flip-flop/latch 140 can either be a rising edge triggered flip flop or a transparent latch. Its input is either the output 114 from the RAM 100 or the delayed output from the delay element 116. The output of the data-in multiplexer 443 drives the D input of the flip-flop/latch 140. The Q output of the flip-flop/latch 140 is supplied through the data-out multiplexer 442 to the logic element's output pin 120, where the Q output may travel to other logic elements within the same L0 logic block or exit the L0 logic block to the X1 crossbar network. The flip/flop latch 140 is used when needed for the logic element 526 to implement a particular function. For example, when the logic element 526 simply implements a pure combinatorial function provided by the lookup table 98, the flip-flop/latch 140 may be unnecessary. The Q output from the flip-flop/latch 140 goes to the logic element's output pin 120. The output of the data-in multiplexer 443 can be supplied directly through the data-out multiplexer 442 to the logic element's output 120, thereby bypassing the flip-flop/latch 140. Thus, the Q output 120 of the logic element 526 is programmable to select the output 114 from the RAM 100 directly (with or without the delay added by delay element 116) or the output Q from the flip-flop/latch 140. By transmitting the RAM memory output 114 through components of the logic element 526 (rather than directly) to the X0 interconnect network, additional X0 routing lines are not required to route the memory output. Instead, the RAM memory output 114 simply and advantageously uses part of a logic element 526 to reach the X0 interconnect network. Likewise, the RAM 100 can use some of the logic element's input lines to receive signals and again, additional X0 routing lines are not necessary. Moreover, if only some of the six logic element inputs are consumed by the memory function, the remaining logic element inputs can still be used by the logic element 526 for combinatorial or sequential logic functions. A logic element 526 that has some input lines free may still be used to latch data, latch addresses or time multiplex multiple memories to act as a larger memory or a differently configured memory. Therefore, circuit resources are utilized more effectively and efficiently. This logic element design offers increased density, ease of routability and freedom to assign connections to logic element inputs as needed. This logic element design further provides easy routability with a partially populated crossbar instead of a full crossbar.

The CK clock signal 114 acts as the clock signal to the flip-flop/latch 140 which causes the flip-flop/latch 140 to transfer data from its D input line to its Q output line. The clock enable signal 142 allows the flip-flop/latch 140 to respond to the CK clock signal 114. The RESET signal 122 clears the flip-flop/latch 140 and resets the Q output of the flip-flop/latch 140 to zero. The SET signal 124 sets the Q output of the flip-flop/latch 140 to one.

According to known systems, a four bit lookup table results in a table having the smallest area. However, one example of the preferred embodiment of a system built in accordance with the invention has a six input lookup table 98. The six input lookup table 98 is inside the 64 bit RAM 100 in FIGS. 10 and 11. As the number of inputs to the lookup table 98 increases, the granularity increases but at the cost of increased silicon area. The increase in granularity, which decreases the number of interconnects required, improves the system's capacity and speed performance. Essentially, the increased granularity allows the logic element 526 to have more gates so that the memory 100 in the logic element 526 can be larger. For example, in the example embodiment, a six input lookup table 98 permits a 16 bit memory whereas a 4 input lookup table would allow only a 4 bit memory.

Figure 12:
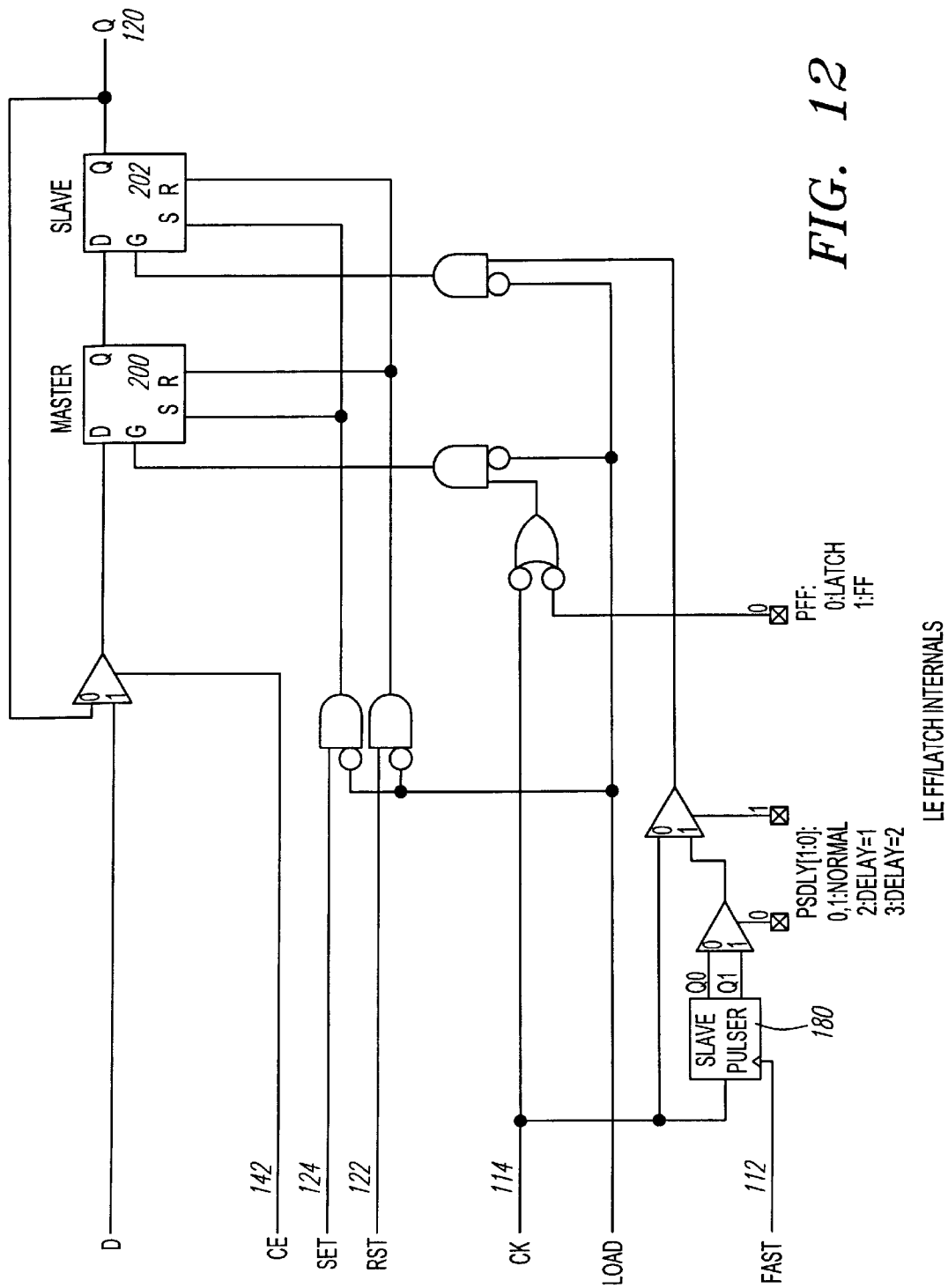
FIG. 12 illustrates a schematic diagram of an example embodiment of the circuitry inside the flip-flop/latch 140 of FIGS. 10 and 11.

The flip-flop/latch 140 has a set input 124 that is independent of the reset input 122. FIG. 12 illustrates the internal circuitry in the flip flop 140 which includes a master latch 200, slave latch 202 and slave pulser 180 which determines the amount of delay between the master and slave latches. If both the master and slave latches 200, 202 are used, the circuit in FIG. 12 acts as a flip flop. If only the slave latch 202 is used, the circuit acts as a latch. Therefore, by having independent set and reset inputs, less combinatorial logic is required which reduces the number of gates required and because these gates require a clock signal, improves the hold time situation. Additional combinatorial logic would increase the complexity of the circuit and timing problems. However, to implement independent set and reset inputs, an additional pin is required.

Figure 17:
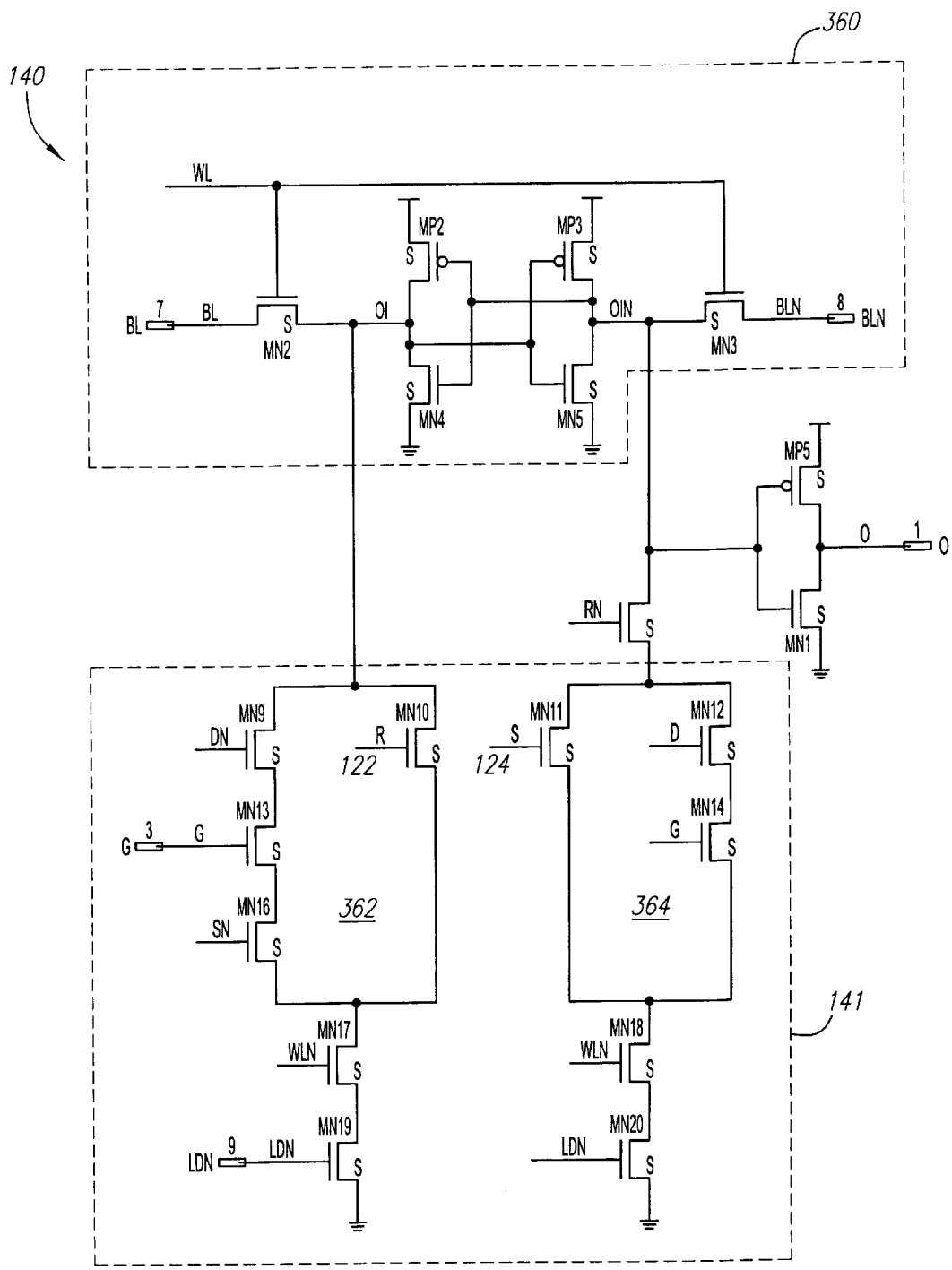
FIG. 17 illustrates a circuit diagram of an example embodiment of a latch inside the flip flop/latch of a logic element built in accordance with the invention.

FIG. 17 illustrates a latch circuit, two of which are in the flip flop 140 of the logic element 526. Circuit 141 has circuits 362, 364 that allow the user to change the state of the memory cell 360. In other words, circuits 362, 364 add latch functions to the memory cell 360. Circuit 141 also has asynchronous set and reset inputs 122, 124.

The fast clock 112 (referred to as FAST clock or MUX-CLK in FIG. 11) drives the slave pulser 180 whose output, after being gated by drivers, goes to gate the slave latch 202. The gating of master latch 200 is determined by LOAD signal and clock CK 114. The clock enable signal 142 controls a driver that receives the data input D. The set signal 124 and reset signal 122 in each of the master and slave latches 200, 202 are independent and separate. A hold time violation may be alleviated by adding the delay at the data path source, by extending the clock CK 114-to-output Q 120 time of the previous state's flip-flop/latch 140 by shaping a new clock signal for the slave latch 202. The clock CK 114 opens the master latch 200 when it is low. Normally, clock CK 114 opens the slave latch 202 when it is high. However, when PSDLY[1] is 1, the slave latch 202 is opened by one of the two slave pulser outputs Q0 or Q1. Q0 goes high the same time the FAST clock 112 goes high after the rising edge of the CK clock 114 and goes low when the FAST clock 112 goes low. This briefly opens the slave latch 202. The effect is to extend the clock CK-to-output Q 120 time by one to two FAST clock periods. The Q1 output pulses one cycle later still, so when selected, it extends the clock CK-to-output Q 120 time by two to three FAST clock periods.

If the flip-flop/latch 140 is used as a latch (PFF=0), the master latch 200 is transparent and the slave latch 202 is the latch. So when PSDLY[1] is 1, the latch will not be open for the duration of clock CK 114. Instead, it will only be open for half a FAST clock period, from one to three FAST clock cycles after the rising edge of the CK clock 114.

The logic element 526 also may include additional circuitry not illustrated in FIGS. 10 and 11, but are well known in the art. For instance, the logic element 526 may further have logic for programming the lookup table 98, logic for programming the configuration bits, logic for loading data into the flip-flop/latch 140, and/or logic for reading the contents of the flip-flop/latch 140 through an external port for design debugging.

Figure 13:
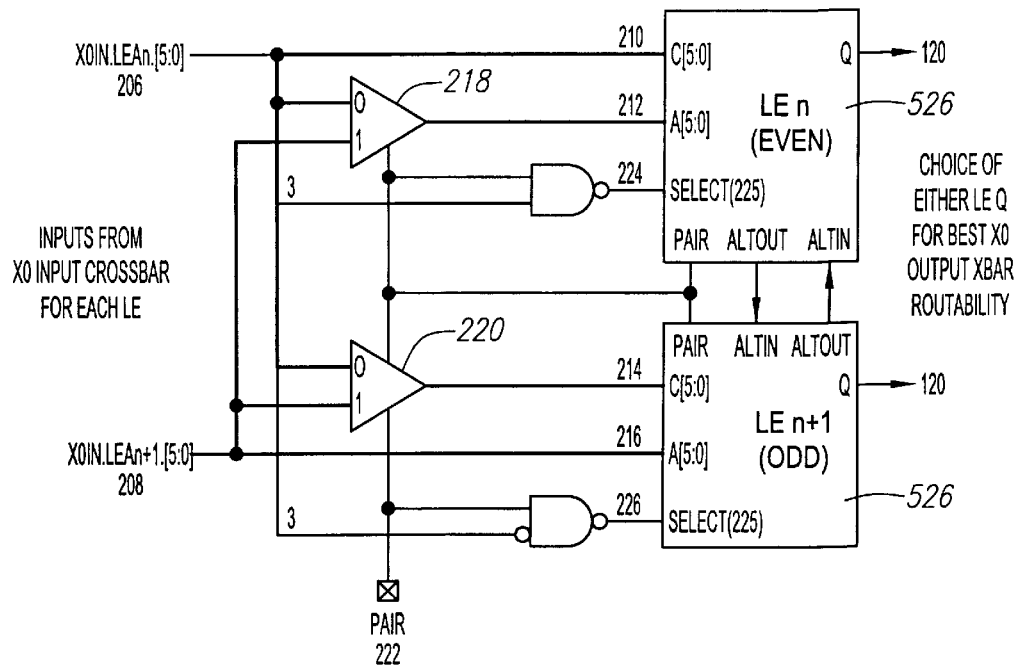
FIG. 13 illustrates a block diagram of an example embodiment of a pair of logic elements having circuitry that allows the logic elements to share inputs.

Two logic elements 526 may be paired so that their RAM memories (16×1) may be combined to form a 128×1 RAM. To accomplish this as shown in FIG. 13, each pair of logic elements 526 has a programming bit (labeled PAIR) 222, a pair of input multiplexers 218, 220 and gates 224, 226. The logic elements 526 are identical. The SELECT signal 225 and PAIR signal 222 control the logic elements 526. An interconnect network between the logic elements 526 allow the logic elements 526 to exchange data (see ALTIN and ALTOUT in FIG. 13). The address ADDR 210 and control inputs are split apart in each logic element 526, forming A[5:0] for the RAM address and C[5:0] for the control and clock inputs. C[5:0] are the WE 106, data input Din 104, set 124, reset 122, clock 114 and clock enable 142 inputs. When the PAIR programming bit is 0, there is no input sharing. The even side six inputs 206 (labeled X0 IN.LEAn.[5:0]) from the X0 input crossbar are routed directly to both the address inputs 212 and control inputs 210 of the even logic element 526. Likewise, the odd side six inputs 208 (labeled X0 IN.LEAn+1.[5:0]) from the X0 input crossbar are routed directly to both the address inputs 216 and control inputs 214 of the odd logic element 526. Thus, the logic elements 526 do not share inputs. The SELECT inputs 225 to both logic elements 526 are true, enabling each RAM's write enable WE 106 and RAM Dout output 114.

When PAIR programming bit is 1, there is input sharing. The odd side six inputs 208 from the X0 input crossbar are routed to the address inputs 212, 216 of both logic elements 526. The even side six inputs 206 from the X0 input crossbar are routed to the control inputs 210, 214 of both logic elements 526. Thus, a total of 12 inputs are shared by both logic elements 526. The odd side six inputs 208 address the RAMs in both logic elements 526. The even side six inputs 206 provide the data in Din104, write enable 106, and flip flop controls for both logic elements 526 and also the seventh address bit (even side bit 3). When the seventh address bit is 0, it asserts the even logic element 526's SELECT input 225 and when the seventh address bit is 1, it asserts the odd logic element 526's SELECT input 225. For the selected logic element 526, the write enable 106 is active and its own RAM output is used as flip flop 140's output. For the deselected logic element 526, the write enable 106 is inhibited and the RAM output of the other logic element 526 is received on its ALTIN input from the ALTOUT output of the other logic element and this RAM output is used as flip flop 140's output. Hence, the logic element pair acts as a single 128×1 RAM. Of course, if the memory sizes in each logic element were changed, the logic element pair would act as a different size memory. Both outputs 120 from the logic elements 526 are available for use. The RAMs 100 of the paired logic elements 526 otherwise operate the same as they do in the single logic element case.

Figure 14:
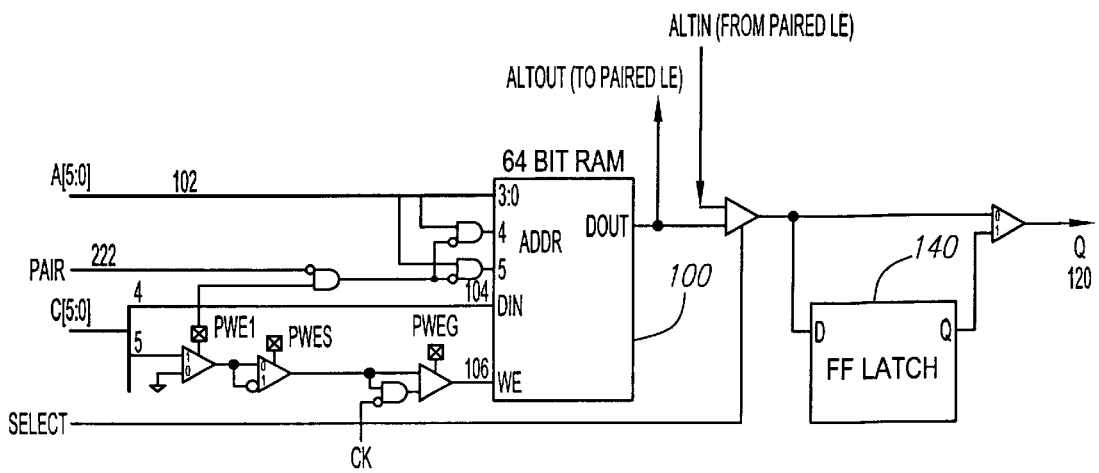
FIG. 14 illustrates a schematic diagram of an example embodiment of circuitry in a logic element configured to share inputs with another logic element.

Turning to FIG. 14, each logic element 526 receives SELECT 225 and PAIR 222 inputs. When PAIR is 0 (normal case), setting PWE1 inhibits RAM address inputs 4 and 5 for the 16×1 RAM mode. When PAIR is 1, the inhibition is blocked, allowing all six address inputs to be used. When SELECT signal 225 is 0, the write enable 106 to the RAM 100 is blocked and the RAM's output from the other logic element 526 is selected instead using the ALTIN path. When SELECT signal 225 is 1, the logic element works normally.

The LE has an optional clocked delay element 116, shown in FIGS. 10 and 11. When the PDDLY programming bit is 1, the delay element 116 adds a delay to the datapath output. Because the delay element 116 is clocked by the FAST clock 112, the amount of delay can be precisely controlled. Older systems used a delay element whose delay was dependent on semiconductor processing and was thus, imprecise and uncontrollable. In the example embodiment, the delay element 116 can be controlled to have a delay between a ½ clock cycle and 2 clock cycles. One example embodiment of the delay element 116 is a pair of edge-triggered flip flops connected in series and clocked by the FAST clock 112. The delay element 116 permits the system to treat the flipflop/latch 140 as a logic element. By adjusting the amount of delay introduced by the delay element 116, the system can relieve the hold time requirement on the flip-flop/latch 140, allowing the input signal to change earlier without causing a hold time violation. Guaranteeing hold time is a key to a good emulation design. A typical user of one or two FPGAs would have a hold time guaranteed by the chip. However, in a huge system such as an emulation system, the clock skew is greater so hold time cannot be guaranteed unless if special design considerations are taken to synchronize all of the clocks in the system. If the ½ clock to 2 clock cycle delay range is inadequate, the FAST clock 112 feeding the delay element 116 can be decreased or increased. Although the example embodiment uses a FAST clock 112 of 32 megahertz (MHz) or 64 MHz, any speed clock is contemplated. By varying the period of the FAST clock 112, as much delay as needed can be inserted. Additional data path delay can be programmed by compounding logic elements in series, setting all but the last for pass-through delay.

Figure 21A:
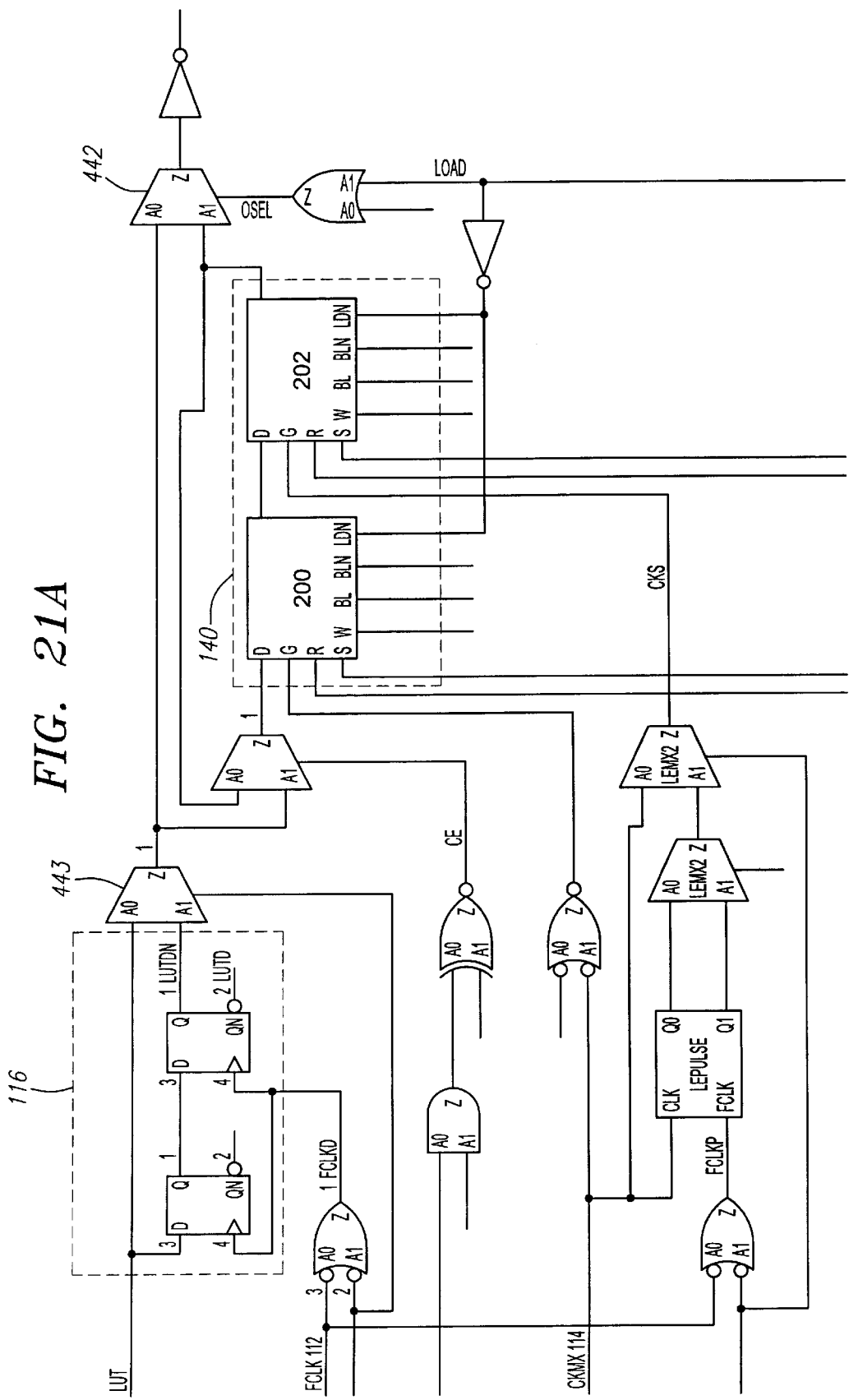
FIG. 21 illustrates a circuit diagram of an example embodiment of the read ports used by the logic analyzer.
Figures 21, 21B:
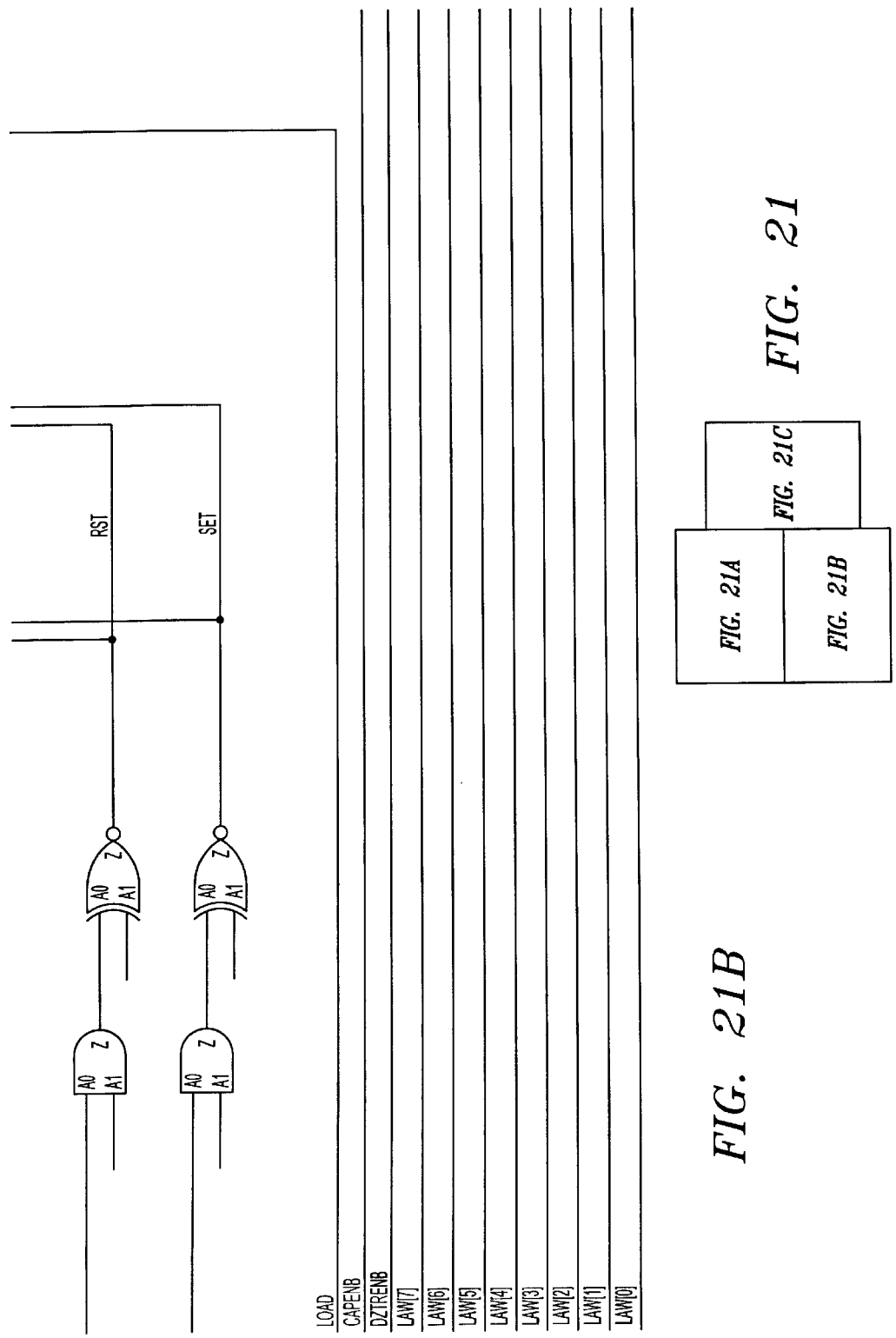
Figure 21C:
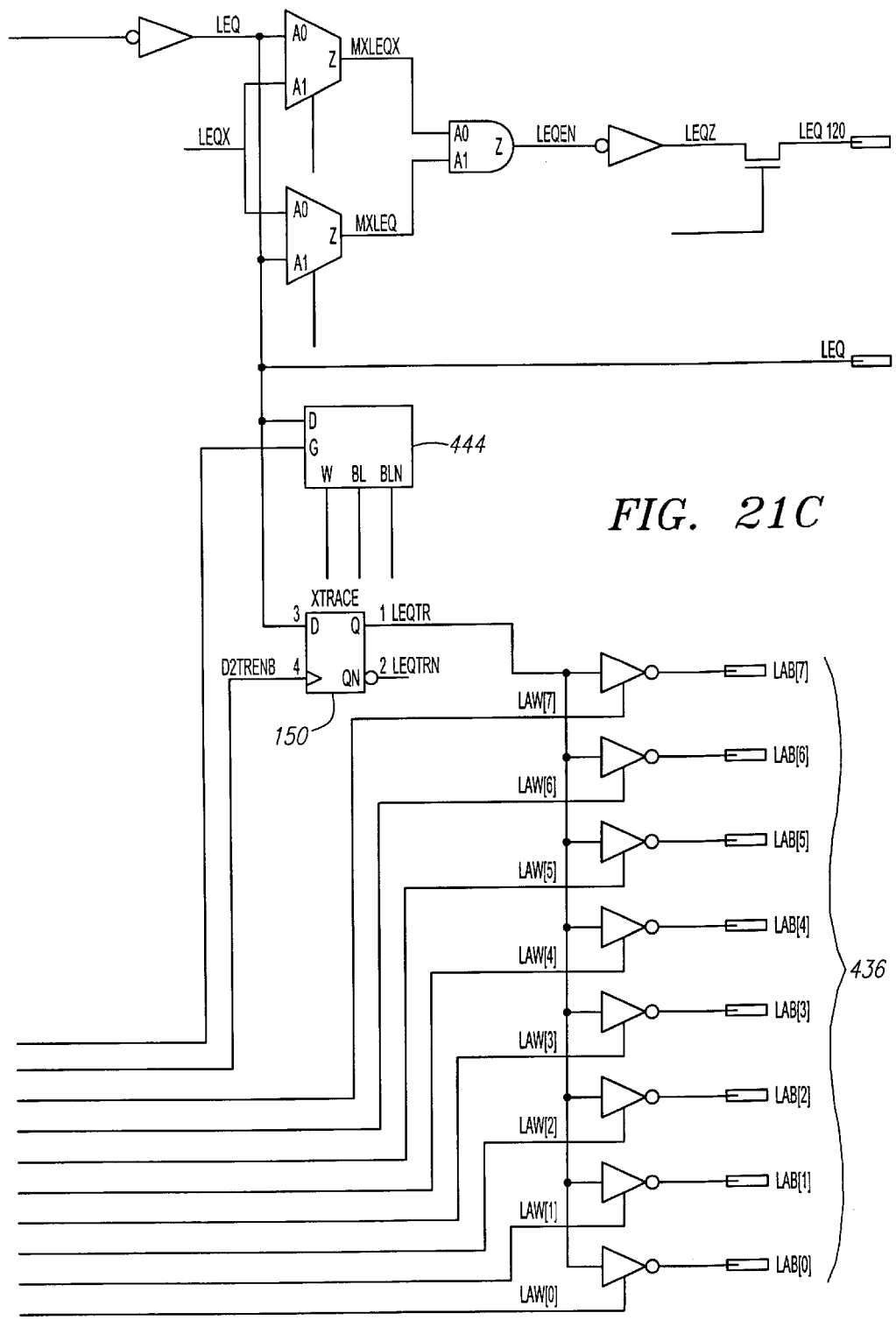

The FAST clock 112 is used to clock the delay element 116 so that the delay introduced by the delay element 116 can be precisely controlled. The FAST clock 112 is also used to clock the timing correction logic 298 (see FIGS. 15, 21) in the flipflop/latch 140. As shown in FIG. 21, flip-flop/latch 140 is comprised of two latches 200 and 202. Latch 200 is the master stage and latch 202 is the slave stage. When the logic element LE 526 is used to emulate a flip flop based design, both stages are used. When the logic element LE 526 is used to emulate a latch-based design, only the slave latch is used. The timing correction logic 298 uses the rising edge of clock 114 to produce two delayed pulses of precise widths, one of which may be selected to clock the slave latch 202. When emulating flip flop based designs, using circuit 298 to produce a delayed pulse to clock the slave stage guarantees non-overlap with the clock for the master stage 200, and it delays the data output slightly to help compensate for clock skew to any subsequent flip flop stages in the emulated circuit, thus ensuring hold time. The non-overlapping clock signals are shown in FIG. 16.

Figure 15:
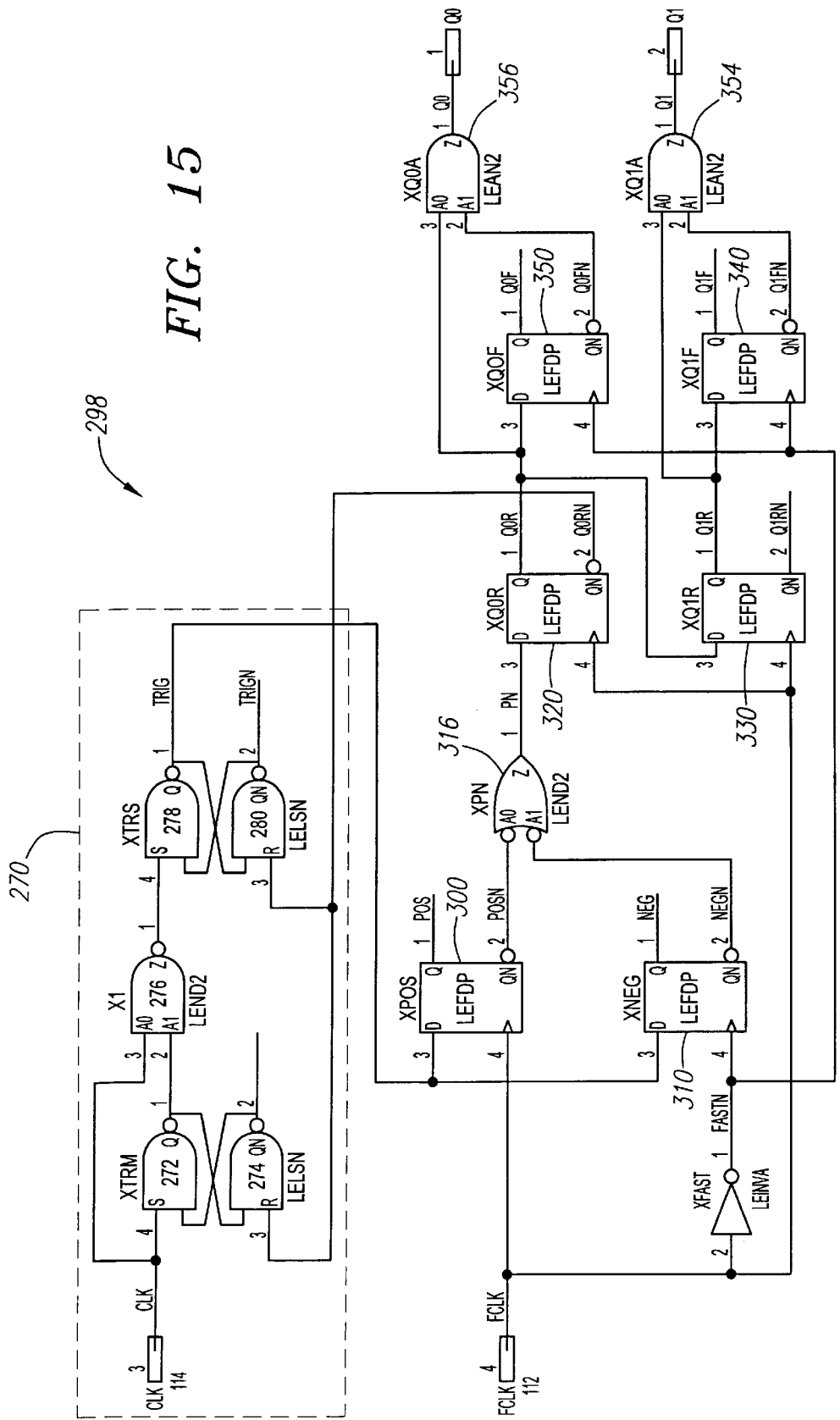
FIG. 15 illustrates a schematic diagram of an example embodiment of the timing correction circuitry which generates two non-overlapping clock signals.
Figure 16:
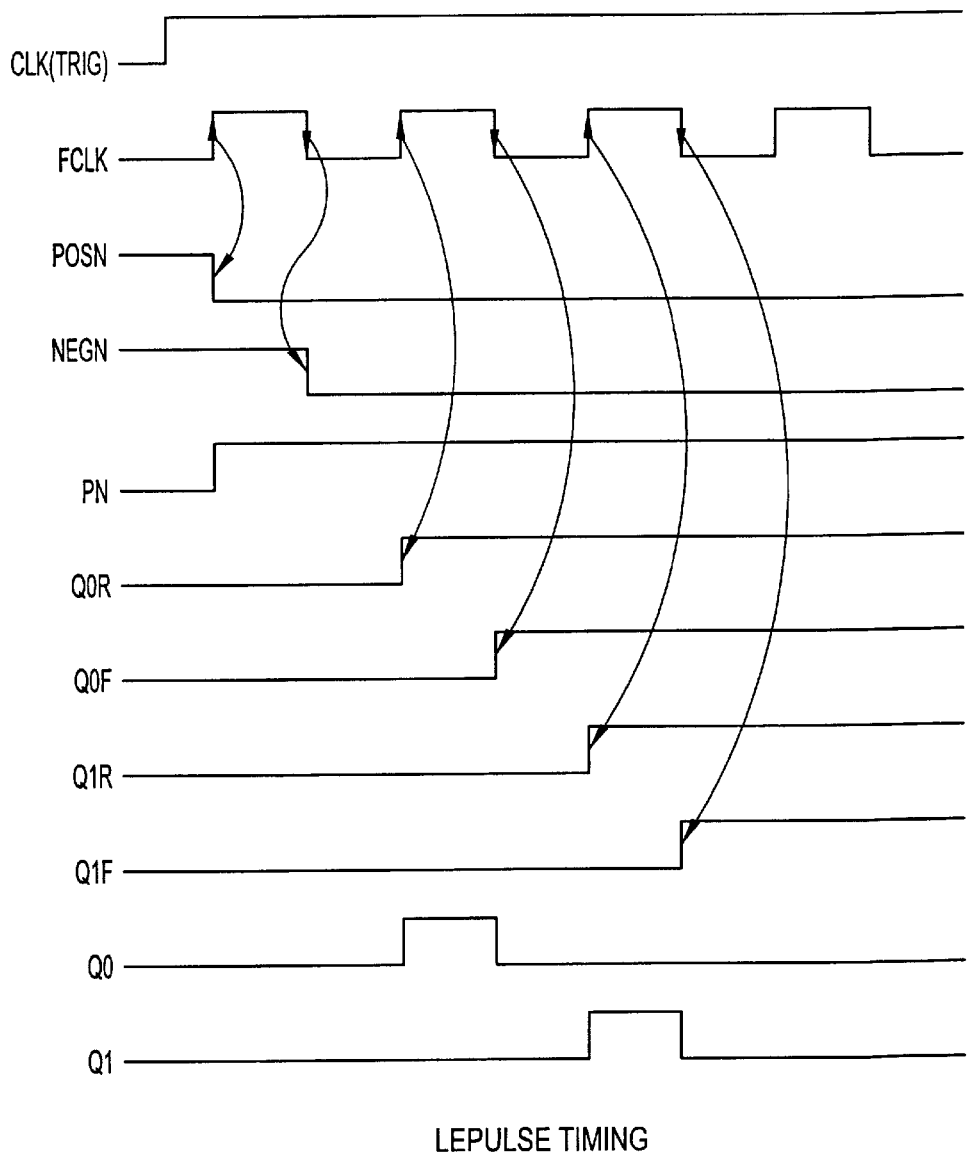
FIG. 16 illustrates a timing diagram for the circuit of FIG. 15.

The timing correction circuit 298 is a pulse forming circuit that generates the delayed slave latch clocks, as shown in FIG. 15. An asynchronized edge detector circuit 270 receives a clock signal 114 and comprises NAND gates 272, 274, 276, 278 and 280. A rising edge on clock signal 114 produces an active high assertion of the TRIG signal. Flip flop 300 detects the assertion of the TRIG signal on the rising edge of the FAST clock 112 (labeled FCLK in FIG. 15). Flip flop 310 detects the assertion of the TRIG signal on the falling edge of the FAST clock 112. A Demorgan variant NAND gate 316 receives the outputs of the flip flops 300, 310 and produces a PN signal which is essentially a new version of the TRIG signal synchronized to both the rising and falling edges of FAST clock 112. Flip flops 320 and 350 form a two stage shift register with the first stage clocked by the rising edge of the FAST clock 112 and the second stage clocked by the falling edge of the FAST clock 112. As the PN signal propagates through these two stages, AND gate 356 produces an active high pulse on signal Q0 whose width is equal to the difference in phase of the rising and falling edges of FAST clock 112. Signal Q1 is produced in a similar fashion, but is delayed by one cycle of FAST clock 112. Q0 and Q1 are thus the delayed slave latch 202's clocks which may be selected for use via the logic element configuration. This timing correction circuit 298 creates the timing diagram of FIG. 16.

The system may also have a shadow register, also called the capture latch 160 in FIG. 11. The capture latch 160 is shown in greater detail in FIG. 18. When gated by the CAPENB signal, the capture latch 160 saves a copy of the Q output 120 of the LE 526 in memory cell 361 and is used for debugging purposes. This particular embodiment of the capture latch 160 uses the same circuit as that of the latch circuit shown in FIG. 17 except that there are no asynchronous set and reset inputs in FIG. 18.

Besides the capture latch 160, the system also may have a shadow RAM, also called the playback RAM. The RAM 100 may be a 16×4 (rows by columns) RAM, for example. Thus, the RAM 100 can act as four separate 16×1 RAMs. When one of the four RAMs is used to store emulation data, the other three 16×1 RAMs may act as playback RAMs. The playback RAM improves existing RAMs 100 of the logic element 526 by giving the RAM 100 an additional function. While the RAM 100 functions as (1) a lookup table and (2) a memory, the playback RAM permits playback functions with save and restore capabilities. In this particular example embodiment, when the system writes data into the 16×1 memory in the RAM 100, the data is simultaneously also written into one to three playback RAMs (each of 16×1 size). Thus, the memory in the RAM 100 may have up to three shadow copies in the playback RAM, assuming a total memory size of 48×1 and a playback RAM of 16×1 each. The playback RAM significantly improves the performance of the logic analyzer which is a tool used to debug the system. Hence, the system may make up to three copies of the RAM memory, each copy representing the state of the memory at a different time. The logic analyzer then can study the saved data to debug the system. The greater the number of copies made of the memory (all at different points in time), the smoother the playback and the greater information available to be diagnosed.

Figure 19:
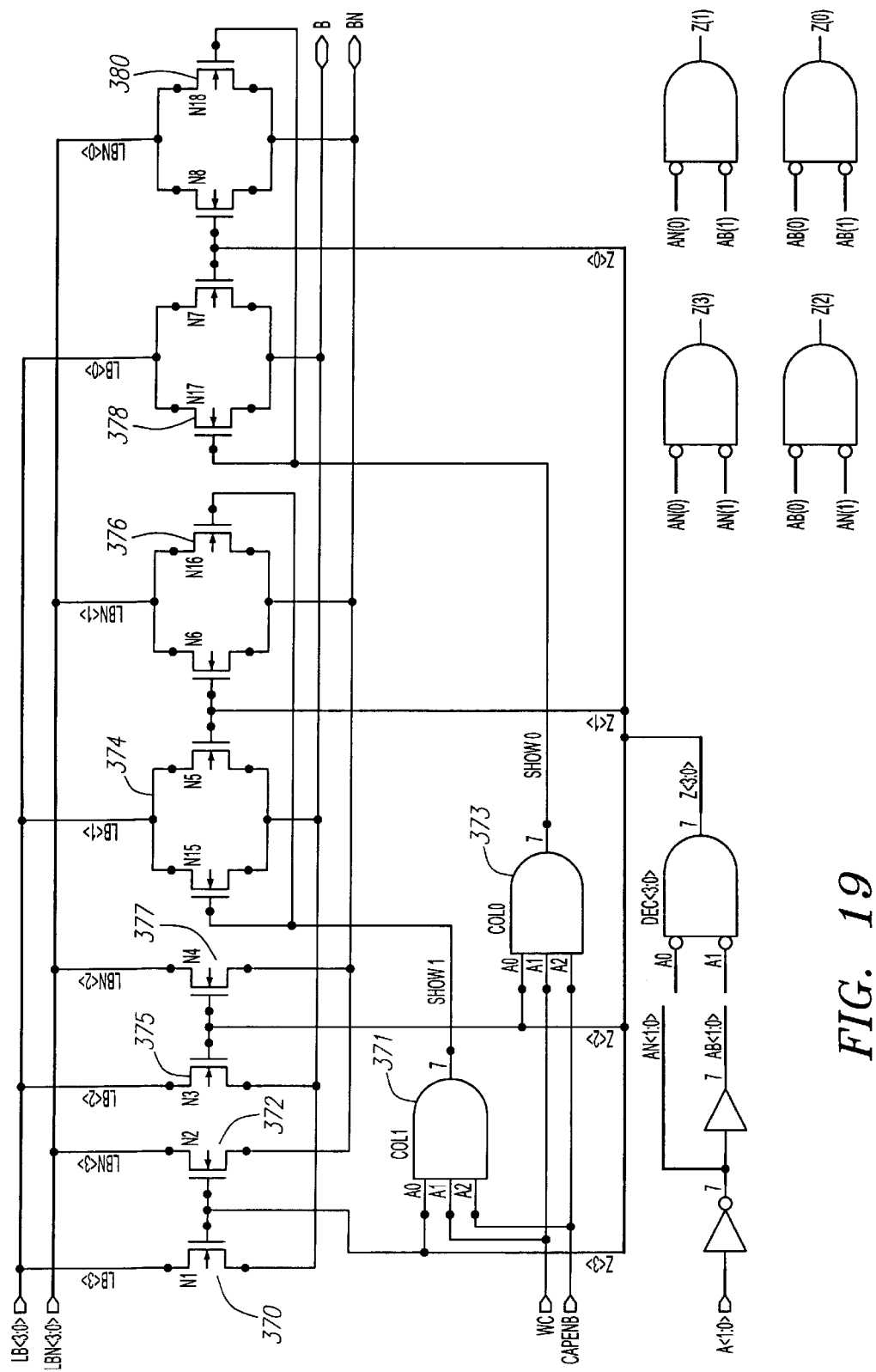
FIG. 19 illustrates a circuit diagram of an example embodiment of a shadow RAM built in accordance with the invention.

FIG. 19 illustrates a column decoder used to implement simultaneous writing into the shadow RAM(s). When data is written into one of the 16×1 RAMs in the RAM 100, the data may simultaneously be copied/written into up to three of the other 16×1 RAMs in the RAM 100. A row decoder and the column decoder of FIG. 19 are used to select the memory cell in the RAM 100 to which the data is to be stored. The column decoder of FIG. 19 enables the data to be written simultaneously into a plurality of other memory cells because the column decoder can select a plurality of columns at a time. Thus, if the column decoder selects three columns, then the data will be written into the three memory cells located at the intersections of the three columns and the row selected by the row decoder. More specifically, a pair of pass transistors are turned on in order to select a column in the RAM 100. Thus, in the normal case, when output Z(3)

is active (high), transistors 370 and 372 turns on. However, if signal CAPENB is active (high), the column decoder will save a copy of the data into at least one of the shadow RAMs. Specifically, signal SHDW1 from the AND gate 371 turns on when signal CAPENB is active, which turns pass transistors 374 and 376 on to select a column in the shadow RAM. Similarly in the normal case, when output Z(2) is active (high), transistors 375 and 377 turn on. However, if signal CAPENB is active (high), signal SHDW0 from the AND gate 373 turns on, which then turns the pair of pass transistors 378 and 380 on to select a column in the shadow RAM.

The shadow RAM 362 also permits a save and restore function. The save and restore function allows the system to start an emulation from its middle, instead of at the beginning. Note that if two logic elements are combined to form a 128×1 RAM, the logic element will not have a shadow memory.

Figure 20:
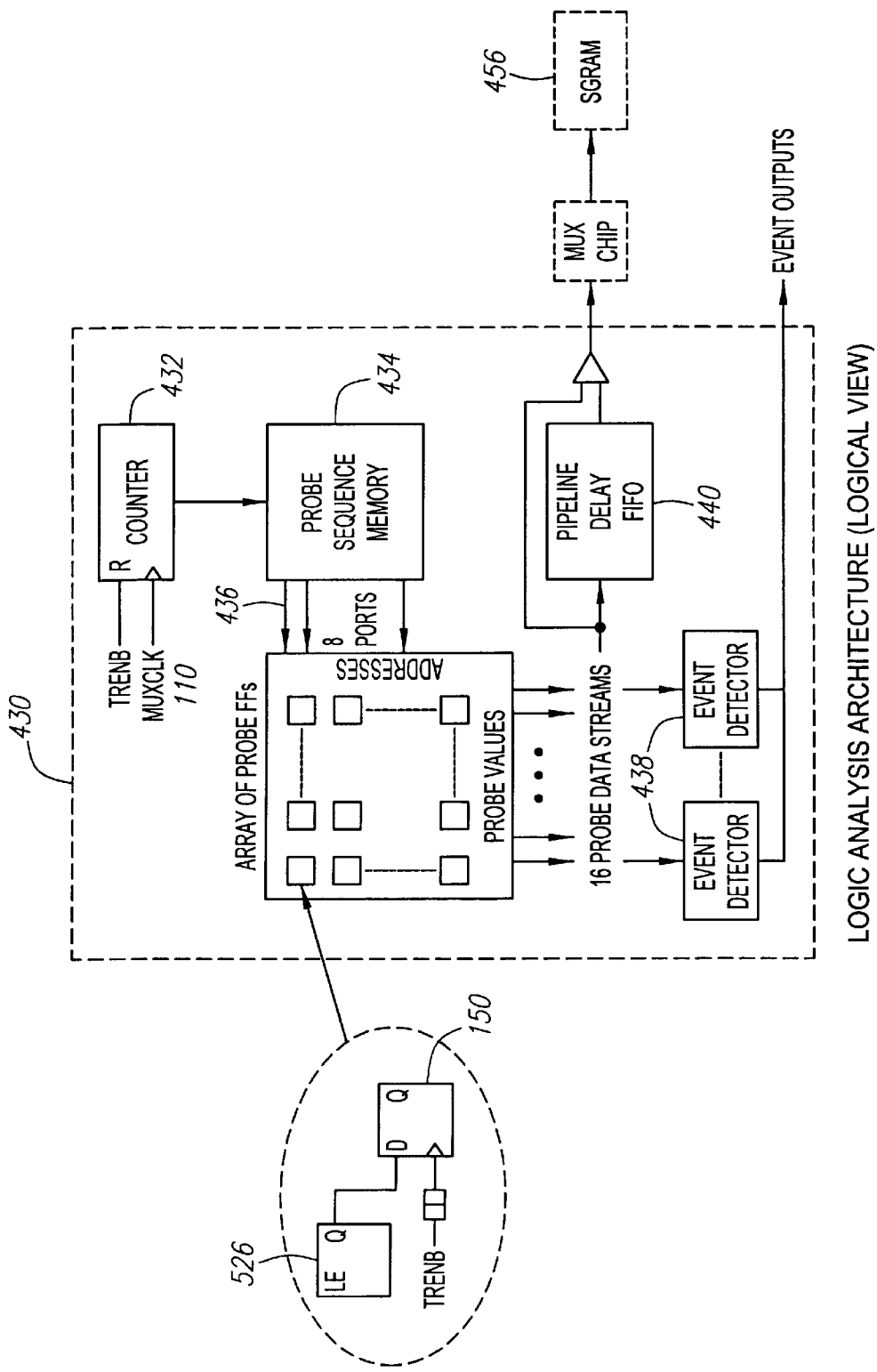
FIG. 20 illustrates an overall logical diagram of an example embodiment of the logic analyzer.

For debugging and data analyzing purposes, it is necessary to read the data from the output of the flip-flop/latch 140 of each logic element 526 as well as the data output from the combinatorial logic in RAM 100 from the delay element 116. To read out this data, each logic element 526 has eight read ports, shown generally in FIG. 20. FIG. 20 illustrates a logical view of the major components of the logic analyzer 430 which is used for debugging purposes. The logic analyzer 430 has an array of probe flip flops 150. Each probe flip flop 150 captures a sample of the data in the logic element 526 upon the trace clock's rising edge (see TRENB on FIG. 20 or D2TRENB on FIGS. 21–22). In order to read out the data from the probe flip flops 150, read ports 436 are shared by the probe flip flops 150 connected to each logic element 526. In this particular example embodiment, there are eight read ports, although certainly the number of read ports may be increased or decreased as desired. The eight read ports 436 allows any probe flip flop 150 to be read out in a random access fashion into any of 16 probe data streams. The probe sequence memory 434, addressed by the incrementing counter 432, addresses these read ports 436 on every cycle of the MUXCLK 110. Because it is very costly from a gate point of view to read out data from all the flip flops 140, a time division multiplexing scheme is used. The MUXCLK 110 is divided by 64 so the emulation chip has a total of 64 time domains; however, by using both the rising and falling edges of the clock pulses, up to two copies of the data can be made. The data read out is sent to event detectors 438 and a pipeline delay FIFO (first in, first out) buffer 440. The FIFO 440 delays the probe data streams by one trace clock cycle for event detection and optionally delays the probe data streams by seven trace clock cycles to allow time for system-wide event resolution. The probe data stream outputs are connected to the X1 interconnect 521 of the L1 block 505 and may be routed to any input/output pin, for eventual routing into the board-level synchronous graphics RAM (SGRAM) 456. Each of the twelve event detectors 438 monitors up to sixteen probe flip flops 436 for all eight event outputs. Thus, the number of eventable probes (probe flip flops 150) is the number of probes in each probe data stream times 12. In this particular example embodiment, 16 probe data streams, with up to 64 probe flip flops 436 each, are generated. These serial probe data streams may contain any probe flip flop data in any order and may be routed to any input/output block. Because every location in the emulation chip can be randomly accessed, the emulation chip, though a field programmable gate array, acts like a static RAM (SRAM). This structure permits the user to do fully interactive probing and event definition of any circuit node at full sample rates during emulation. If, for example, the MUXCLK 110 is 32 megahertz (MHz), a maximum of 1024 probe flip flops 150 can be read out in 64 MUXCLK clock cycles, which results in a 0.5 MHz sample rate. At a sample rate of 16 MHz, 32 probe flip flops can be read out, two per probe data stream because each read port 436 is read twice per MUXCLK clock cycle, once when MUXCLK 110 is high and once when MUXCLK 110 is low. Of course, the number of time domains can be changed, increased or decreased, as desired.

Figure 18:
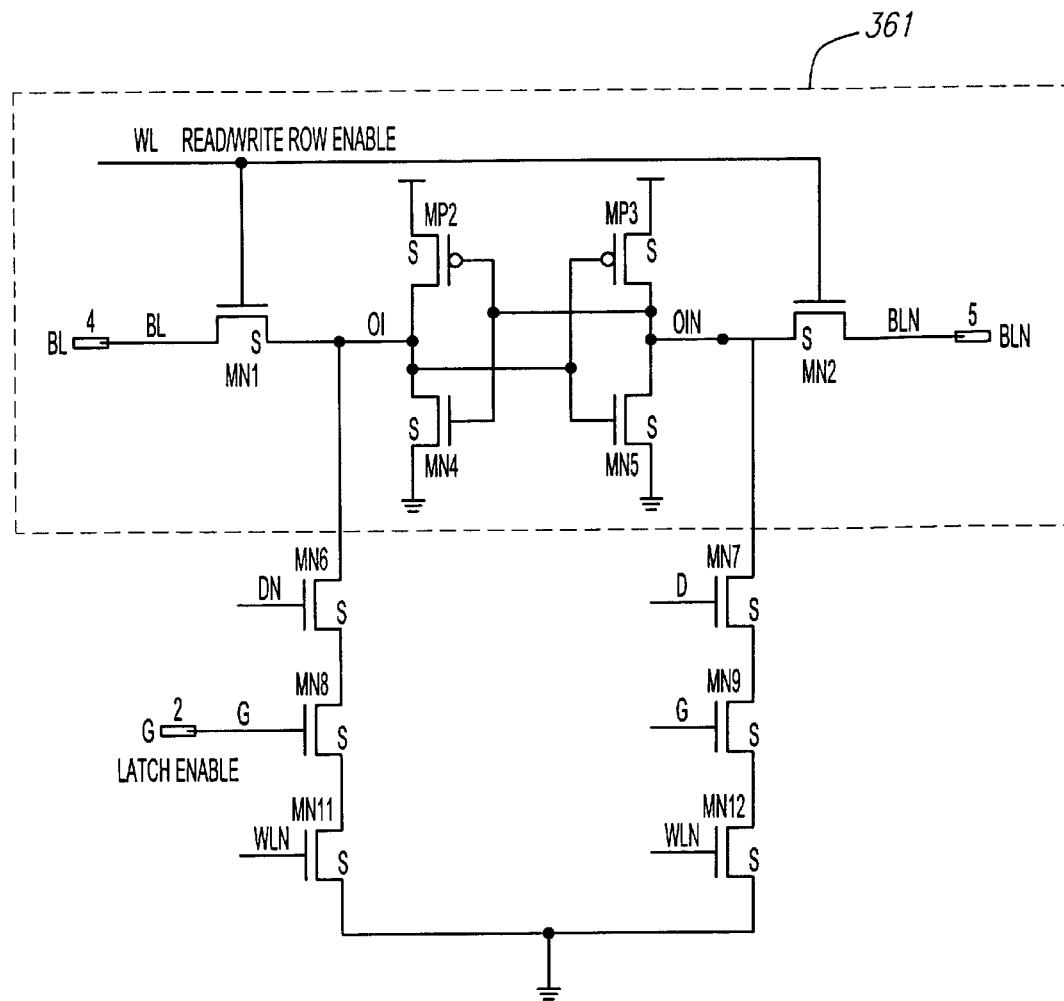
FIG. 18 illustrates a circuit diagram of an example embodiment of a capture latch built in accordance with the invention.

FIG. 21 illustrates a circuit diagram of the read ports 436 and how they are connected to the probe flip flops 150 of the logic element 526. The first read port is connected to the output of the probe flip flop 150. The input to the probe flip flop 150 comes from the output (after buffers and inverters) of the multiplexer 442. The multiplexer 442 outputs either the combinatorial logic output (which may be delayed or not by delay element 116) or the output from the slave latch 202 of the flip-flop/latch 140. The timing correction circuitry 298 supplies the two non-overlapping clock pulses that are used to gate the slave latch 202. FIG. 18 illustrates the circuitry in block 444.

Figure 22:
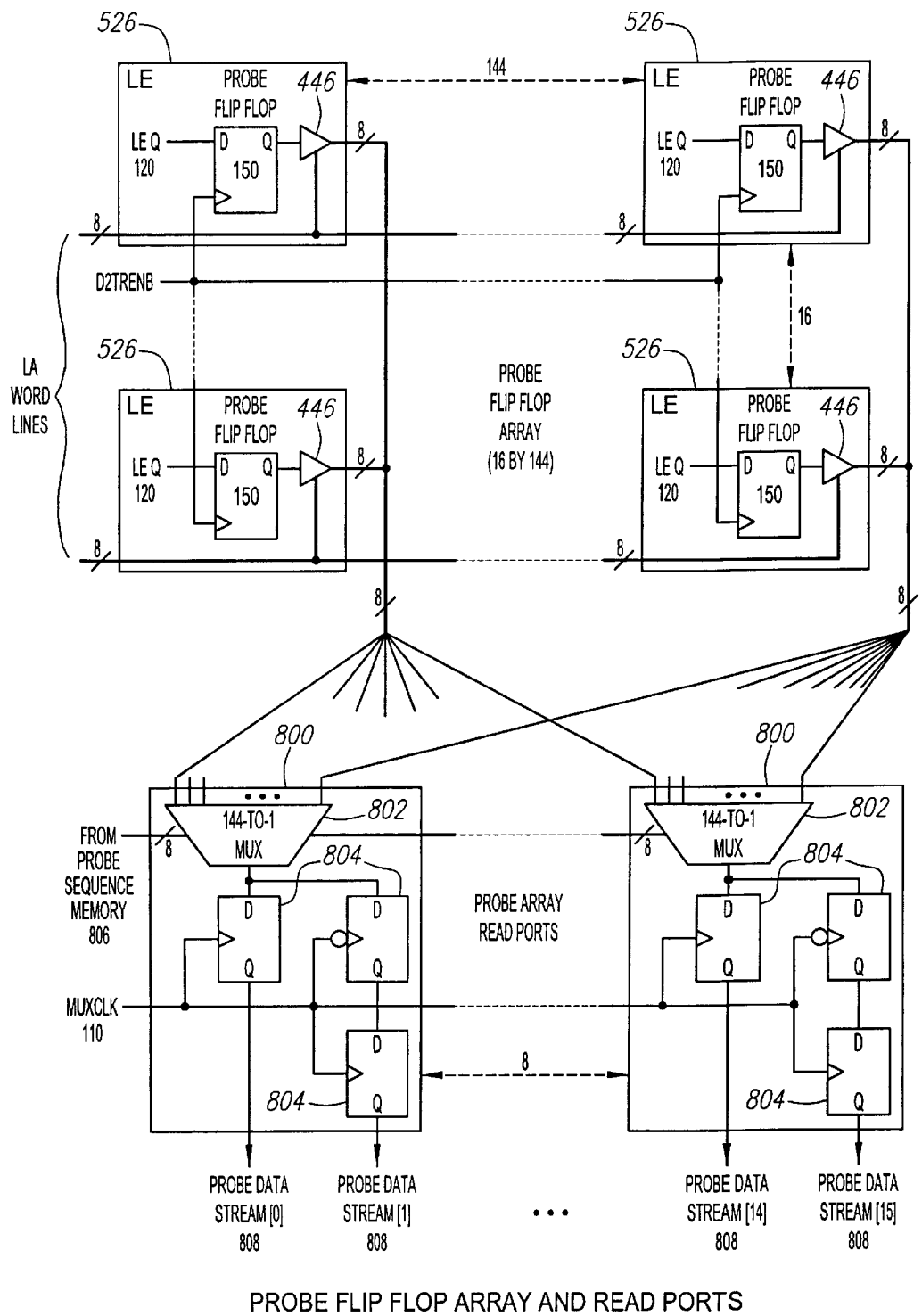
FIG. 22 illustrates a circuit diagram of an example embodiment of the read ports and their connections to the logic elements.

FIG. 22 illustrates an example embodiment of how the read ports 800 may be connected to the logic elements 526. In this example, there are eight read ports 800. Each logic element 526 can send its LE Q output 120 to a probe flip flop 150. As clocked by D2TRENB, the probe flip flop 150 outputs data to tristate drivers 446. Drivers 446 are actually eight drivers in parallel in this example because there are eight bit lines per column of logic elements 526. There are also eight word lines per row in the logic analyzer (LA). The eight word lines from the logic analyzer select one of the eight drivers 446 to activate. The driver 446 passes a bit of information to each of the read ports 800. Thus, the eight drivers 446 in a given logic element 526 send eight bits to the eight read ports 800, where each bit of information goes to a different read port 800. In this example embodiment of a read port, a read port 800 comprises a 144-to-1 multiplexer 802 and three D flip flops 804 which are clocked by MUXCLK 110. The 144-to-1 multiplexer 802 receives a bit from each driver 446, for a total of 144 bits, and selects one bit based on the probe sequence memory input 806. This selected bit is inputted into two of the flip flops 804. The flip flops 804 serve to clock the bit information synchronously out as sixteen bits of probe data 808.

Figure 23:
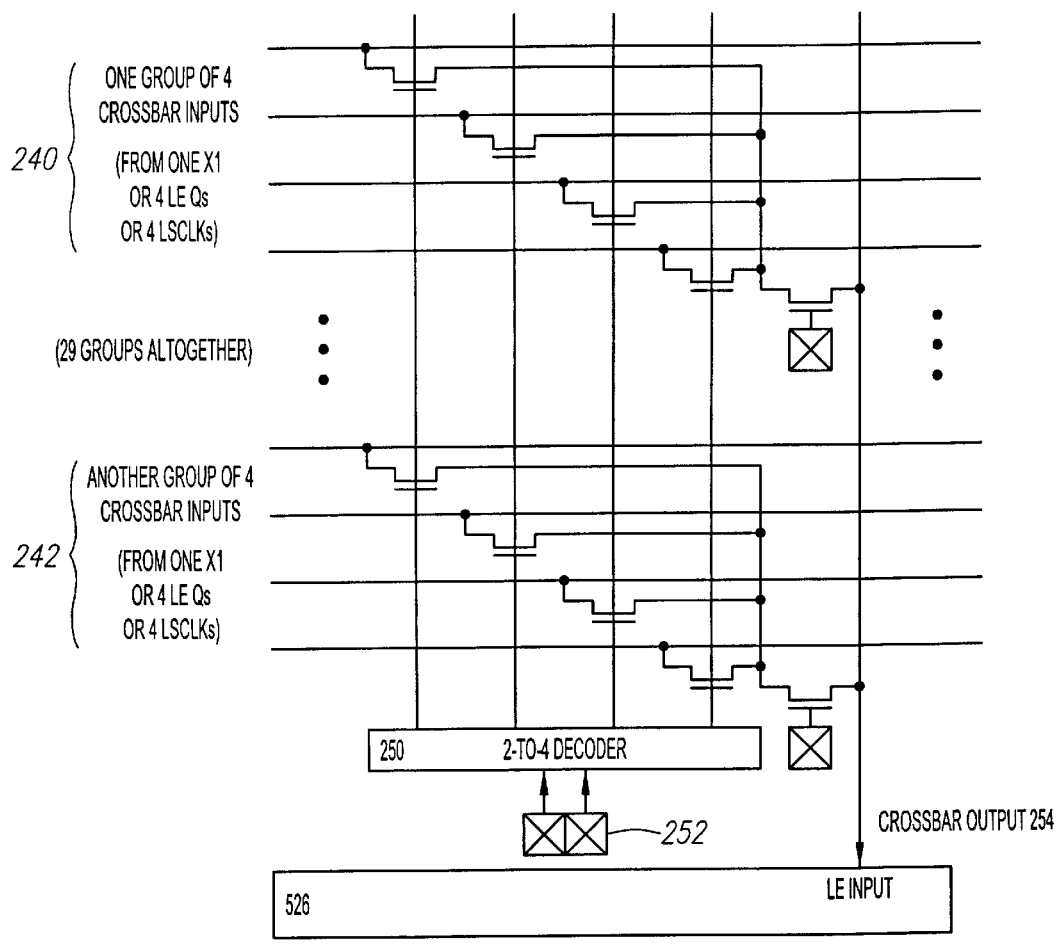
FIG. 23 illustrates a circuit diagram of an example physical implementation of the X0 input crossbar.

Turning to FIG. 23, a predecoder for the X0 input fully populated crossbar 600 reduces the area of the resulting chip. As a result, the X0 full crossbar has two levels: the first level does a predecode and the second level finishes the decoding. Crossbar inputs are grouped into four where a 2-to-4 decoder 250 selects crossbar outputs 254 to input into the logic element 526. For any given crossbar input, each input has a switch to a common line for the input group of four. Two programming bits at the crossbar output turn on one of the four switches of all groups. Each input group has one more programming bit which turns on a switch from the group's common line to the actual crossbar output 254.

Returning to FIG. 2, input/output block 436 will be discussed in greater detail. Input/output block 436 may be, for example, the embodiment shown in FIG. 32. In order to reduce the number of pins, each input/output pin may be time multiplexed. Thus, each pin carries four signals, or any desired number of signals. Each input/output block 436 in this example has four input or output lines (A, B, C, D). The input/output block pin crossbar 702 allows signals A, B, C and D to be multiplexed onto one of signals IO.n.0, IO.n.1, IO.n.2, or IO.n.3. One signal from the input/output pad 435 may be multiplexed onto one of signals A, B, C, or D so that the input/output pad 435 may carry up to four separate signals in a time multiplexed fashion.

Figure 24:
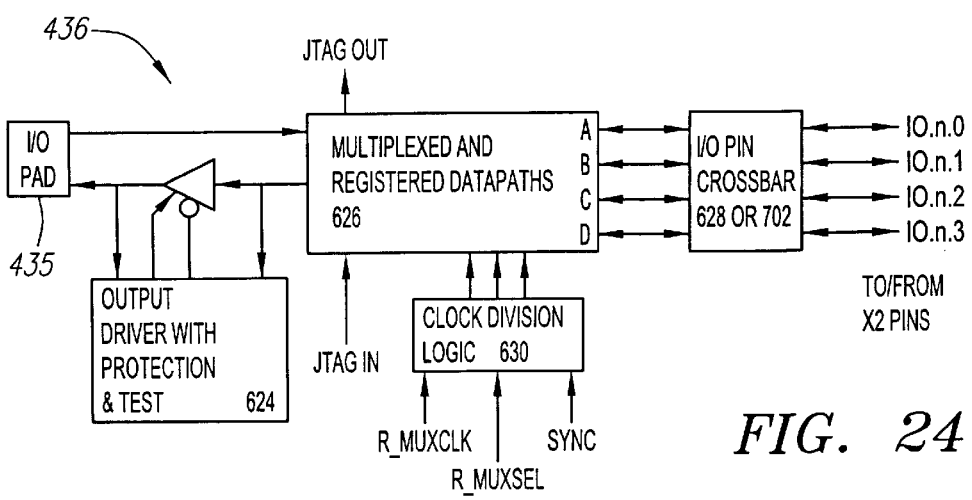
FIG. 24 illustrates a block diagram of an example embodiment of the major components of the input/output block.

Turning to FIG. 24, the major components of the input/output block 436 are the input/output pad 435, output driver 624 that is connected to the input/output pad 435 and passes an output signal to the input/output pad 435 while protecting the input/output pad from overcurrents caused by pin contention, multiplexed datapaths 626 that serve as interconnect paths, input/output pin crossbar 628 coupled between the multiplexed datapaths 626 and the X2 interconnect, and a clock division logic circuit 630. The MUXCLK 110 controls the phase of each input/output pin. Each pin may be bidirectional or not. As described below with respect to FIGS. 25–32, variations include configuring a pin to carry one signal, two signals, or four signals, in a bidirectional or unidirectional manner. Signals A, B, C and D denote signals internal to the input/output block 436, while signals IO.n.0, IO.n.1, IO.n.2, and IO.n.3 represent signals external to the input/output block 436. The output driver 624 includes an overcurrent detector and current limiting circuit which detects an short on any output, creates an interrupt on the dedicated open collector output pad and limits the current on the shorted pin to a safe level. The location of the shorted pin may be read back later over the JTAG bus. The error detection logic works in non-multiplexed modes by monitoring the state of the input/output pad 435 whenever the pad is being driven. If the pad 435 is being driven low but remains too high or is being driven high and remains too low continuously for a period longer than one error clock cycle, the error detection logic in output driver 624 will be triggered.

Figure 25:
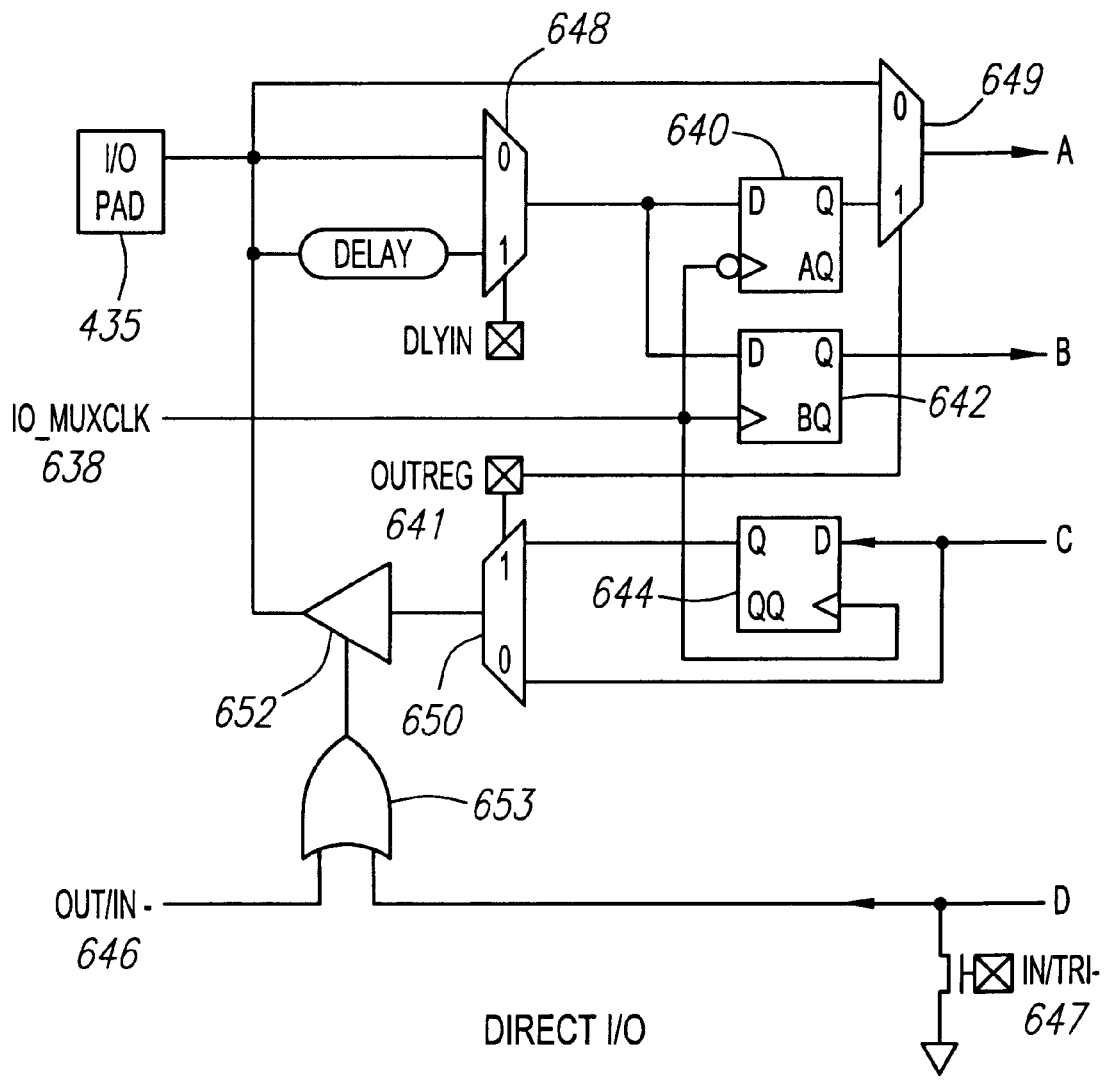
FIG. 25 illustrates a circuit diagram of an example embodiment of a direct input/output block.

FIG. 25 illustrates an input/output block 436 that is configured for direct input/output only (i.e., not configured for time multiplexing). The advantage of a direct input/output block is it is faster than an input/output block that uses time division multiplexing. Output signals A and B travel from the input/output pad 435 to other circuits, while input signals C and D travel from other circuits to the input/output pad 435. Programming bit OUTREG 641 controls whether multiplexer 649 passes the data from the input/output pad 435 or the Q output of the flip flop 640 to output signal A. For example, if OUTREG 641 is a 0, the multiplexer 649 passes the data from the input/output pad 435 to output signal A. If OUTREG 641 is a 1, the multiplexer 649 passes the data from the Q output of the flip flop 640 to output signal A. Similarly, programming bit OUTREG 641 also controls whether multiplexer 650 passes the data from input signal C or the Q output of the flip flop 644 to the output I/O pad driver 652 and then to the input/output pad 435. If programming bit OUTREG 641 is a 1, the flip flop 644 clocked by the rising-edge of IO_MUXCLK 638 is in the output data path from input signal C, and the flip flop 640 clocked by the falling-edge of IO_MUXCLK 638 is in the input data path to output signal A. Output signal B is driven with the value passed through a flip flop 642 clocked by the rising-edge of IO_MUXCLK 638. If the programming bit OUT/IN- 646 is a 1 which goes to OR gate 653, the output I/O pad driver 652 is always on and the output signal C is sent to the input/output pad 435. If OUT/IN- 646 is zero, input signal D controls the driver 652. For example, if the input/output pad 435 is to be a simple input to signal A, signal D will be low and signal IN/TRI- 647 will be 1, which will pull signal D down to zero, turning the driver 652 off. If the input/output pad 435 is to be bidirectional, signal IN/TRI- 647 will be zero. As controlled by programming bit DLYIN, multiplexer 648 selectively inserts a delay between the input/output pad 435 and the input of flip flops 640, 642.

Figure 26:
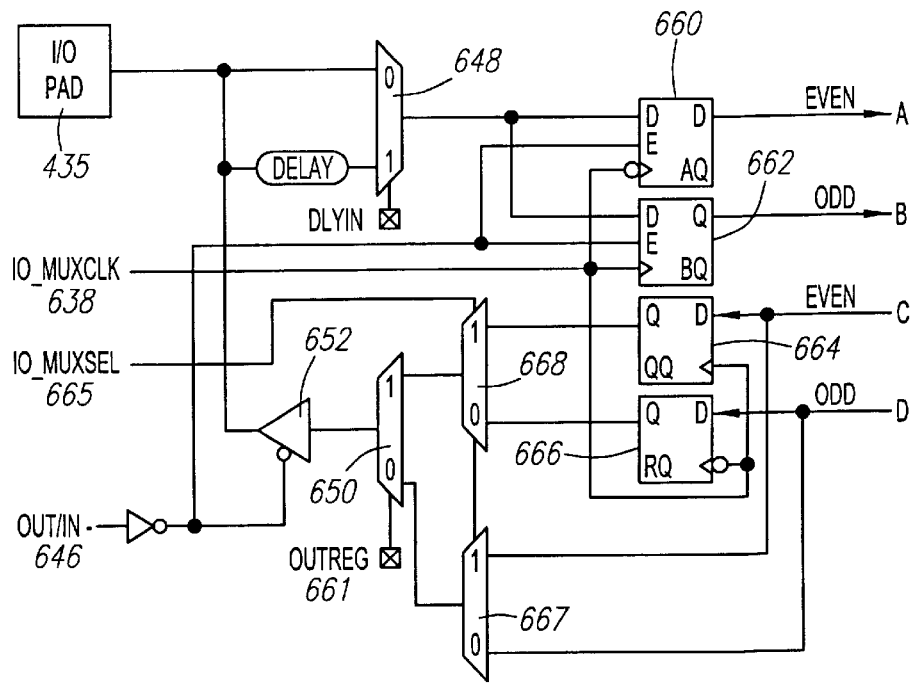
FIG. 26 illustrates a circuit diagram of an example embodiment of an input/output block configured for 2 way time multiplexing.
Figure 27:
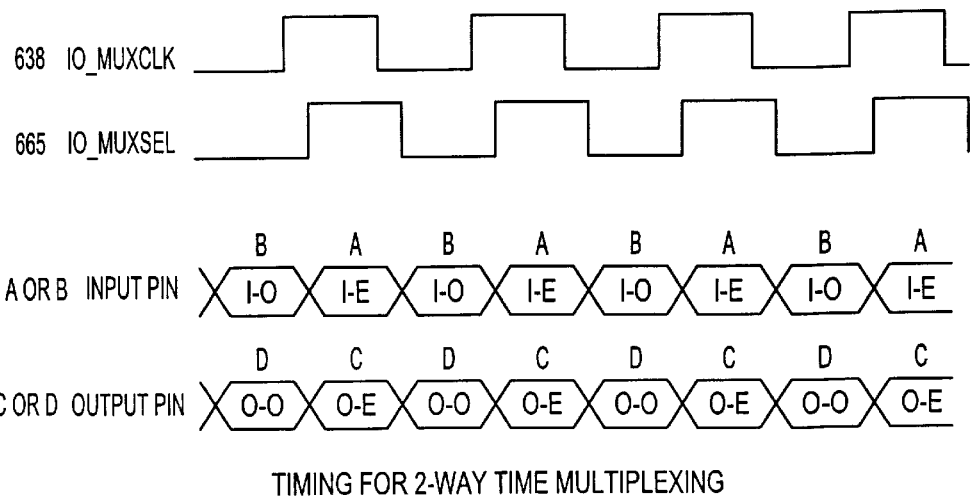
FIG. 27 illustrates a timing diagram for the input/output block of FIG. 26.

FIG. 26 illustrates a portion of an input/output block 436 that is configured for two way time-multiplexing. Signal IO_MUXCLK 638 is the same as MUXCLK 110 as it exists in the input/output block 436. Signal IO_MUXSEL 665 is the same as MUXSEL. The input/output pad 435 carries up to two input signals or up to two output signals. If it carries two input signals, the signals are time multiplexed onto output signals A and B. If it carries two output signals, the signals are time multiplexed from input signals C and D. If OUT/IN- 646 is active (high), the output driver 652 is enabled and the input/output pad 435 acts as an output pin to carry a signal derived from either input signal C or D. If OUT/IN- 646 is inactive (low), the input/output pad 435 is an input pin, its output is disabled and the input sampling flip flops 660, 662 are enabled. For a pin to behave as a 2-way multiplexed pin, the input flip flops 660, 662 always operate on every clock edge, demultiplexing the pin into "Even" and "Odd" signals A and B. In other words, the input/output pad 435 may carry two signals, one of which is multiplexed out as signal A and the other is multiplexed out as signal B. FIG. 27 depicts an example timing diagram for the 2 way time multiplexed input/output block of FIG. 26. I-O and I-E stand for odd input (B) and even input (A) respectively. O-O and O-E stand for odd output (D) and even output (C) respectively. When the input/output block is sending data onto its input pins A and B, the odd input signal (designated as "I-O" for input-odd in FIG. 27) is multiplexed out as signal B. Then the even input signal (designated as "I-E" for input-even in FIG. 27) is multiplexed out as signal A. This pattern repeats, as shown by the "B, A, B, A . . ." pattern. Similarly, the input/output pad 435 may carry two signals, one of which is multiplexed from signal C and the other is from signal D. When the input/output block is receiving data from output pins C and D, the odd output signal (designated as "O-O" for output-odd in FIG. 27) is multiplexed from signal D to the input/output pad 435. Then the even output signal (designated as "O-E" for output-even in FIG. 27) is multiplexed from signal C to the input/output pad 435. This pattern repeats, as shown by the "D, C, D, C . . ." pattern.

Programming bit or signal OUTREG 661 controls which signal is passed by multiplexor 650. "Even" and "Odd" output signals C and D are registered by output flip-flops 664, 666 if OUTREG 661 is 1, otherwise they are multiplexed directly to the input/output pad 435. When IOMUXCLK 638 rises, the even output signal A is sampled from C by flip flop 664. Soon IO_MUXCLK 638 goes up, and either the recently sampled even output signal C or the even output signal C itself is multiplexed onto the output pin A. On the input pin, it will be sampled by flip flop 660 on the falling edge of IO_MUXCLK 638 and become the A input signal. One half an IO_MUXCLK cycle elapses between the sampling of the output signal C to the updating of the input signal A. When IO_MUXCLK 638 falls, the odd output signal B is sampled from input signal D by flip flop 666. Soon IO_MUXCLK 638 goes down and either the recently sampled odd output signal D or the odd output signal D itself is multiplexed onto the output pin B. On the input pin, it will be sampled by flip flop 662 on the rising edge of IO_MUXCLK 638 and become input signal B. As controlled by programming bit DLYIN, multiplexer 648 selectively inserts a delay between the input/output pad 435 and the input of flip flops 660, 662.

Figure 28:
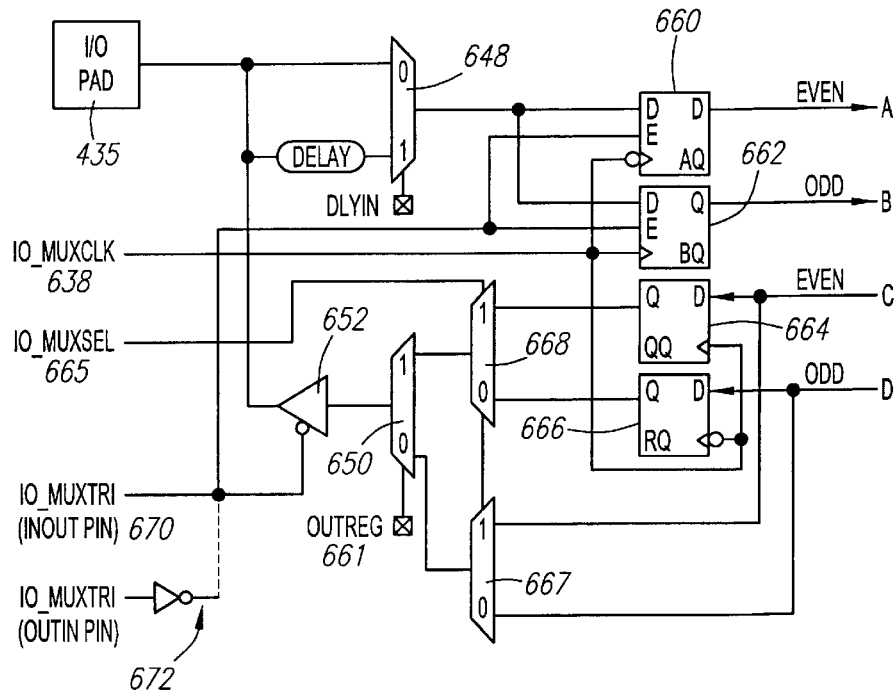
FIG. 28 illustrates a circuit diagram of an example embodiment of an input/output block configured for 4 way bidirectional time multiplexing.
Figure 29:
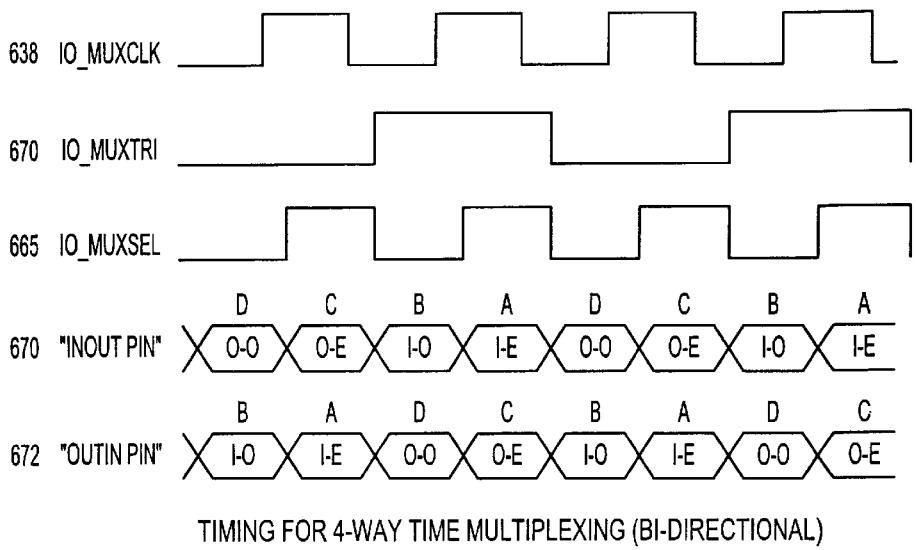
FIG. 29 illustrates a timing diagram for the input/output block of FIG. 28.

FIG. 28 illustrates a portion of an input/output block 436 that is configured for four way bidirectional time-multiplexing. FIG. 29 illustrates the timing for the circuit of FIG. 28. The input/output pad 435 may carry up to four time multiplexed signals. In this bidirectional case, the four time multiplexed signals comprises two input signals and two output signals. Thus, two outputs are sent and two inputs are received on one pin. The circuit is similar to that of FIG. 26, except that OUT/IN- 646 of FIG. 26 is split into inout pin 670 and outin pin 672, which in this example embodiment is the IO_MUXTRI signal and its inverse. IO_MUXTRI 670 is a global signal on the system board and can be used by all emulation chips. Some chips will act as receivers while others will act as transmitters. The inverse of IO_MUXTRI signal is provided for coordinating the timing between receiving chips and transmitting chips. IO_MUXTRI signal 670 and its inverse 672 take turns driving the input/output on the four-way time-multiplexed pins A, B, C and D. IO_MUXTRI is used to alternate the drive direction on the line. When IO_MUXTRI is high, outin pin 672 drives signal D, then signal C, and inout pin 670 enables the inputs to flip flops 660, 662 to receive signals and output them as signals B and A respectively. When IO_MUXTRI falls, inout pin 670 drives signals D and C while outin pin 672 enables flip flops 660, 662 to receive signals as signals B and A. The result is sending two signals each way on one wire, each signal getting updated every two IO_MUXCLK 638 cycles. As controlled by programming bit DLYIN, multiplexer 648 selectively inserts a delay between the input/output pad 435 and the input of flip flops 660, 662.

Figure 30:
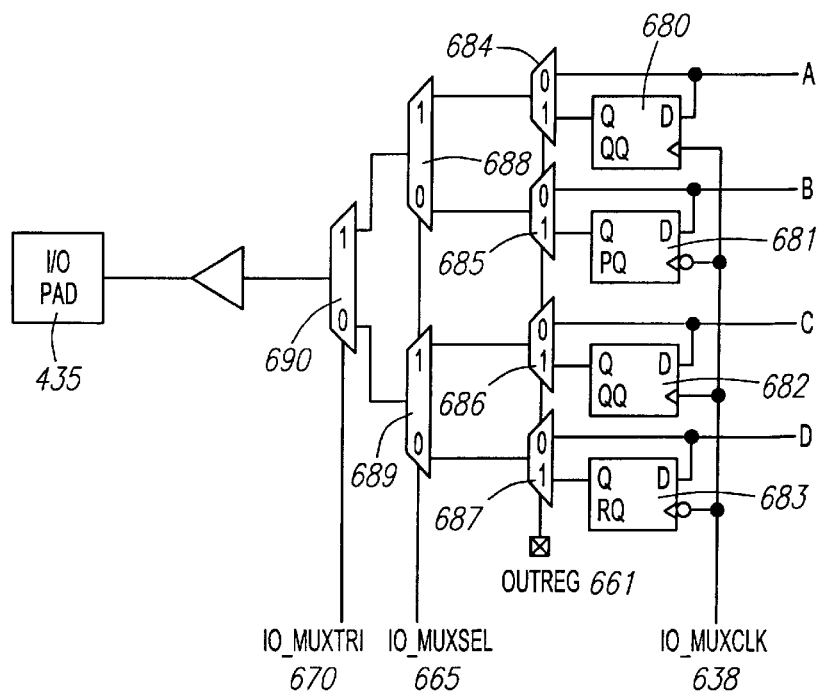
FIG. 30 illustrates a circuit diagram of an example embodiment of an input/output block configured for 4 way unidirectional output time multiplexing.

FIG. 30 illustrates a portion of an input/output block 436 that is configured for four way unidirectional output time-multiplexing. The advantages offered by this mode affect partitioning and electrical signal integrity. With bidirectional four-way multiplexing, the total proportion of chip inputs to chip outputs is always 1:1 which might constrain the partitioning of logic into the chip. With unidirectional four-way multiplexing, any total proportion of inputs to outputs is possible. In bidirectional multiplexing, the signal direction on the interconnecting wire is always being set by MUXTRI (or IO_MUXTRI) so a brief contention of the two output drivers is possible. With unidirectional multiplexing, no output contention is possible. Four signals from the X2 crossbars are driven through the input/output block pin crossbar 702 onto signals A, B, C and D, as shown in FIG. 32. 4-to-1 multiplexers 688, 689, 690 are controlled by IO_MUXSEL signal 665 and IO_MUXTRI signal 670 and combines the four signals A, B, C and D as a four way time multiplexed output signal on the input/output pad 435.

Figure 32:
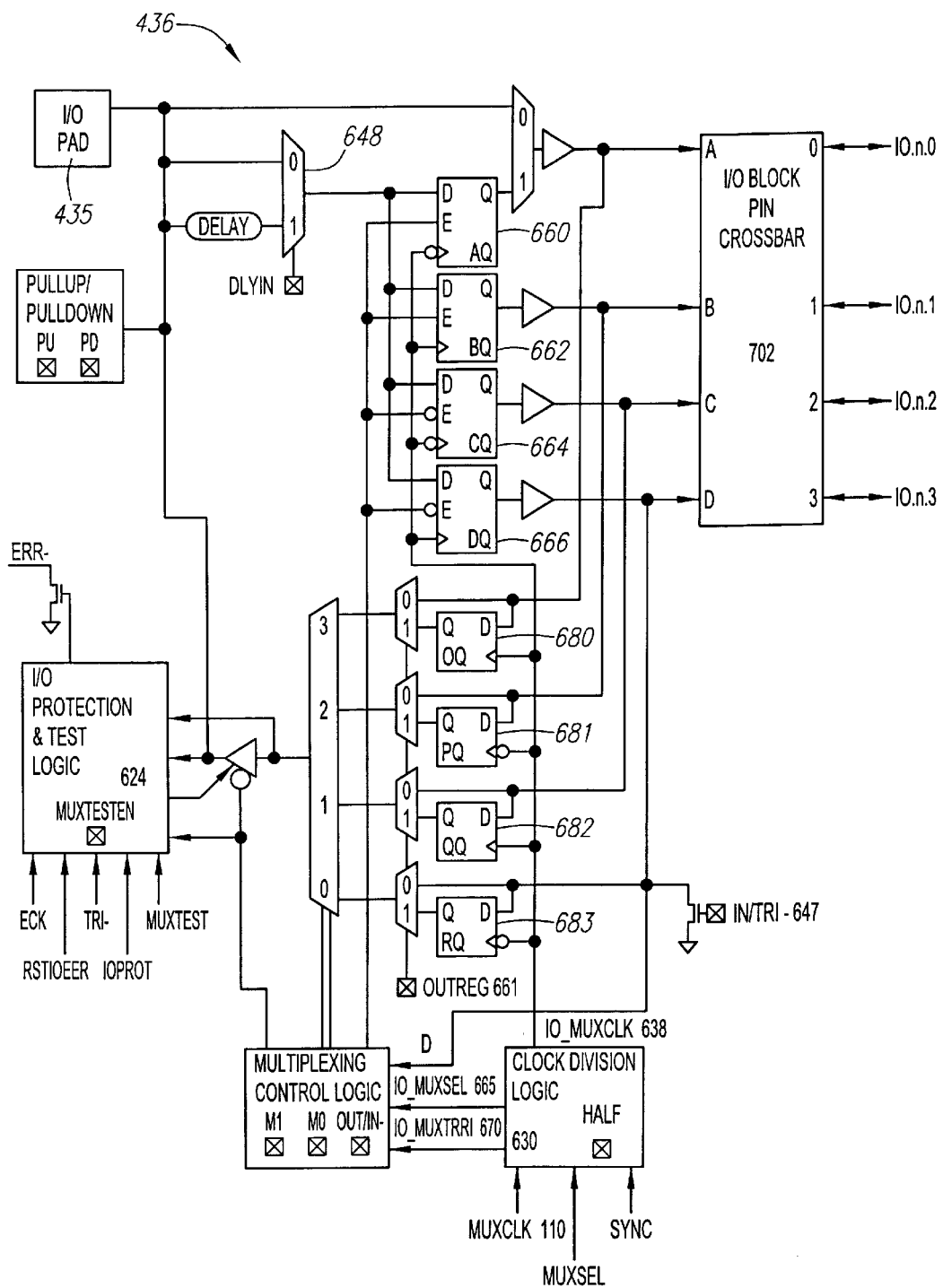
FIG. 32 illustrates a detailed block diagram of an example embodiment of an input/output block.

FIG. 32 illustrates an example embodiment of input/output block 436 which can be configured to perform the functions of FIGS. 25–30. That is, the circuit of FIG. 32 can be configured to perform two-way or four-way multiplexing, bidirectional multiplexing, unidirectional multiplexing, or direct input/output. The input/output block 436 incorporates the input/output block crossbar 702, time multiplexed A, B, C and D signals, time multiplexed external pins IO.n.0, IO.n.1, IO.n.2 and IO.n.3, and their associated flip flops, multiplexers and signals. Programming the directions of the bidirectional IO.n.0-IO.n.3 drivers must be consistent with the directions of the X2 pin drivers and the M0, M1 and OUT/IN- signals determine the drive direction of pins A, B, C and D as follows:

| M1 | M0 | OUT/IN | A | B | C | D | |
|---|---|---|---|---|---|---|---|
| 0 | 0 | X | * | - | - | - | No multiplexing, pin is a direct I/O |
| 0 | 1 | 0 | * | * | * | * | 4way multiplexed unidirectional input |
| 0 | 1 | 1 | - | - | - | - | 4way muxed unidirectional output |
| 1 | 0 | X | * | * | - | - | 2-way multiplexing unidirectional I/O |
| 1 | 1 | X | * | * | - | - | 4-way multiplexing bidirectional I/O |

In the table above, * means that the pin is driving data into the input/output block pin crossbar 702 and - means that the pin is receiving data from the input/output block pin crossbar 702. OUTREG 661 controls the 2-to-1 multiplexers associated with flip flops 680, 681, 682 and 683. For example, if OUTREG 661 is 0, data from signals A, B, C, D skip the flip flops 680, 681, 682 and 683 and pass directly to the multiplexers 684, 685, 686 and 687. If OUTREG 661 is 1, data from signals A, B, C, D are input into the flip flops 680, 681, 682 and 683 and then proceed to the multiplexers 684, 685, 686 and 687. Each of the A, B, C and D pins also has a capture latch 720, 722, 724, 726 (also shown as reference number 160 on FIG. 11). Each capture latch 160 operates to capture data when CAPENB signal 161 is 1. Data may be read from and written into the capture latches 160. The decoders 730 and their respective programming bits control how the internal A, B, C and D signals are connected to the external IO.n.0, IO.n.1, IO.n.2 and IO.n.3 pins. If IN/TRI- 647 is 1, signal D is pulled down to zero, as also shown in FIG. 25.

Figure 31:
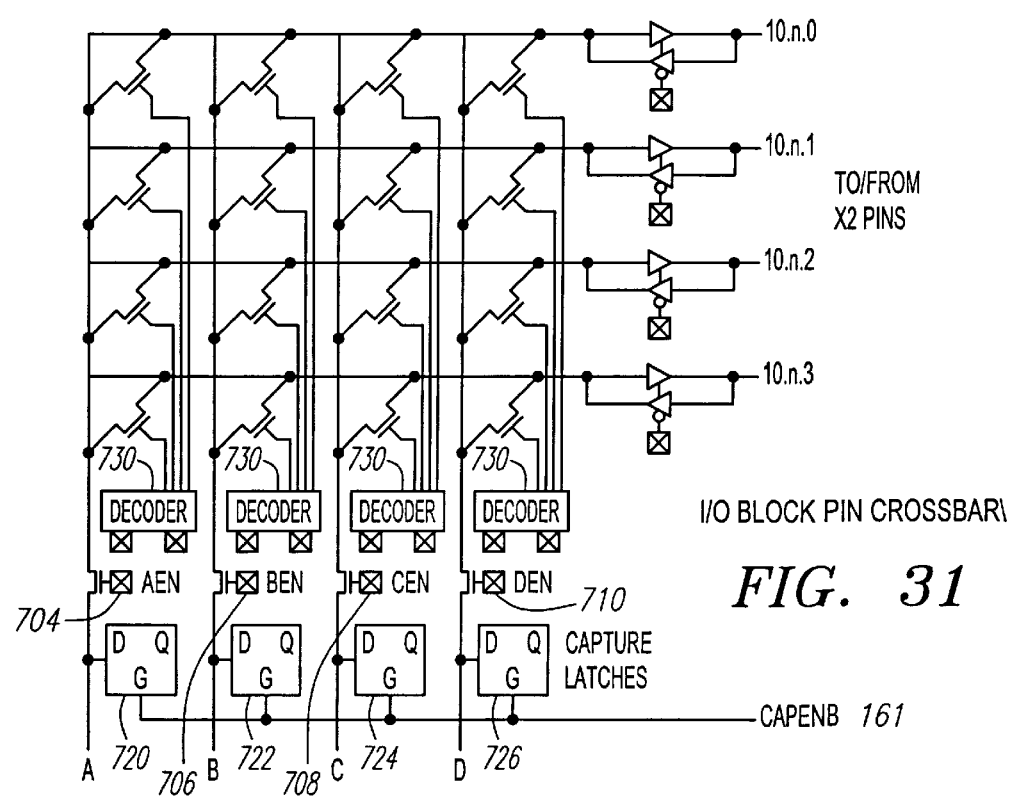
FIG. 31 illustrates a circuit diagram of an example embodiment of an input/output block pin crossbar.

FIG. 31 illustrates the detail of the input/output block pin crossbar 702 of FIG. 32. A 4-by-4 bidirectional crossbar 702 is interposed between the input/output block 436's four internal A, B, C and D pins and its four external pins IO.n.0, IO.n.1, IO.n.2 and IO.n.3. The crossbar 702 functions to allow any of the input/output external pins IO.n.0, IO.n.1, IO.n.2 and IO.n.3 to be used to carry any input/output signal. Since each external pin will be connected to a different X2 crossbar, this design improves the L1/L2 interconnect's routability when the input/output pin locations are fixed. Each of the A, B, C and D internal pins may be connected to one of the IO.n.0, IO.n.1, IO.n.2 and IO.n.3 external pins, according to the two binary-encoded programming bits associated with the decoders 730 for each A, B, C, or D pin. For example, to connect the crossbar 702 to pin A, the AEN programming bit 704 must also be programmed on to close the connection between pin A and the input/output block pin crossbar 702. Otherwise if the AEN programming bit 704 is programmed off, pin A is isolated from the crossbar 702, the IO.n.0, IO.n.1, IO.n.2 and IO.n.3 external pins, and thus the X2 pins. Likewise to connect pins B, C and D to the crossbar 702, one would activate programming bit BEN 706, CEN 708 and DEN 710 respectively. This feature allows unused pins among A, B, C and D to be easily disconnected from the IO.n.0, IO.n.1, IO.n.2 and IO.n.3 external pins, which protects against unintended conflicts between input/output block drivers and X2 pin drivers.

While embodiments and implementations of the subject invention have been shown and described, it should be apparent that many more embodiments and implementations are within the scope of the subject invention. Accordingly, the invention is not to be restricted, except in light of the claims and their equivalents.

What is claimed is:

1. A programmable logic integrated circuit comprising:
   a plurality of logic elements;
   an integrated logic analyzer, said integrated logic analyzer comprising:
      a plurality of probe storage elements, each one of the plurality of probe storage elements in electrical communication with a corresponding one of said plurality of logic elements for capturing a data sample output from said corresponding one of said plurality of logic elements, said plurality of probe storage elements arranged into a probe storage element array on the reprogrammable logic integrated circuit, said probe storage element array having a plurality of read ports and a plurality of probe data stream outputs;
      a probe sequence memory circuit, said probe sequence memory circuit addressing said plurality of read ports to provide for random access through said plurality of probe data stream outputs to any of said plurality of probe storage elements; and
      a plurality of event detectors, said plurality of event detectors in communication with said plurality of probe data stream outputs from said probe storage element array.

2. The programmable logic integrated circuit of claim 1 wherein said plurality of probe storage elements comprise a plurality of probe flip flops.

3. The programmable logic integrated circuit of claim 2 wherein said probe storage element array comprises a probe flip flop array.

4. The programmable logic integrated circuit of claim 1 wherein said probe storage element array is comprised of a plurality of columns of said plurality of probe storage elements, each of probe storage elements being in communication with a plurality of drivers, each of said plurality of drivers in communication with one of a plurality of bit lines, thereby forming a plurality of columns of bit lines.

5. The programmable logic integrated circuit of claim 4, wherein said plurality of read ports further comprise:
   a multiplexer having multiplexer at least one select input and a plurality of data inputs, said multiplexer in communication with one of said plurality of bit lines from each of said plurality of columns of bit lines, said at least one select input receiving address data from said probe sequence memory circuit; and
   at least one read port storage element, said at least one read port storage element receiving data from said multiplexer.

6. The programmable logic integrated circuit of claim 5 wherein said at least one read port storage element outputs data onto a subset of said plurality of probe data streams.

7. The programmable logic integrated circuit of claim 5 wherein said at least one read port storage element comprises a first read port flip flop, a second read port flip flop and a third read port flip flop, said first read port flip flop and said second read port flip flop receiving data from said multiplexer, said third read port flop receiving data from said second read port flip flop, said first read port flip flop and said third read port flip flop being clocked by a clock source and said second read port flip flop being clocked by the complement of said clock source, said first read port flip flop outputting one of said plurality of probe data streams, said third read port flip flop outputting to a second of said plurality of probe data streams.

8. A programmable logic integrated circuit comprising:
   a plurality of logic elements;
   an integrated logic analyzer, said integrated logic analyzer comprising:
      a plurality of probe storage elements, each one of the plurality of probe storage elements in electrical communication with a corresponding one of said plurality of logic elements for capturing a data sample output from said corresponding one of said plurality of logic elements, said plurality of probe storage elements arranged into a probe storage element array on the reprogrammable logic integrated circuit, said probe storage element array having a read port and a probe data stream output; and
      a probe sequence memory circuit, said probe sequence memory circuit addressing said read port to provide for random access through said probe data stream output to any of said plurality of probe storage elements.

9. The programmable logic integrated circuit of claim 8 further comprising a plurality of event detectors, said plurality of event detectors in communication with said probe data stream output from said probe storage element array.

10. The programmable logic integrated circuit of claim 9 wherein said plurality of probe storage elements comprise a plurality of probe flip flops.

11. The programmable logic integrated circuit of claim 10 wherein said probe storage element array comprises a probe flip flop array.

12. The programmable logic integrated circuit of claim 8 wherein said probe storage element array is comprised of a plurality of columns of said plurality of probe storage elements, each of probe storage elements being in communication with a plurality of drivers, each of said plurality of drivers in communication with one of a plurality of bit lines, thereby forming a plurality of columns of bit lines.

13. The programmable logic integrated circuit of claim 12, wherein said plurality of read ports further comprise:
   a multiplexer, said multiplexer in communication one of said plurality of bit lines from each of said plurality of columns of bit lines; and
   at least one read port storage element, said at least one read port storage element receiving data from said multiplexer.

14. The programmable logic integrated circuit of claim 13 wherein said at least one read port storage element outputs data onto a subset of said plurality of probe data streams.

15. A reprogrammable logic integrated circuit comprising:
   a plurality of logic elements;
   an integrated logic analyzer, said integrated logic analyzer comprising:
      a plurality of probe storage elements, each one of the plurality of probe storage elements in electrical communication with a corresponding one of said plurality of logic elements for capturing a data sample output from said corresponding one of said plurality of logic elements, said plurality of probe storage elements arranged into a probe storage element array on the reprogrammable logic integrated circuit, said probe storage element array having a plurality of read ports and a plurality of probe data stream outputs; and
      a probe sequence memory circuit, said probe sequence memory circuit addressing said plurality of read ports to provide for random access through said plurality of probe data stream outputs to any of said plurality of probe storage elements.

* * * * *